United States Patent
Pagnanelli

(10) Patent No.: US 8,089,382 B2
(45) Date of Patent: Jan. 3, 2012

(54) SAMPLING/QUANTIZATION CONVERTERS

(75) Inventor: Christopher Pagnanelli, Huntington Beach, CA (US)

(73) Assignee: Syntropy Systems, LLC, Costa Mesa, CA (US)

( * ) Notice: Subject to any disclaimer, the term of this patent is extended or adjusted under 35 U.S.C. 154(b) by 54 days.

(21) Appl. No.: 12/824,171

(22) Filed: Jun. 26, 2010

(65) Prior Publication Data

US 2010/0328125 A1 Dec. 30, 2010

Related U.S. Application Data

(60) Provisional application No. 61/221,009, filed on Jun. 26, 2009, provisional application No. 61/290,817, filed on Dec. 29, 2009.

(51) Int. Cl.
*H03M 3/00* (2006.01)

(52) U.S. Cl. ......... 341/143; 341/118; 341/120; 341/155

(58) Field of Classification Search ............. 341/118, 341/120, 143, 155
See application file for complete search history.

(56) References Cited

U.S. PATENT DOCUMENTS

| | | | | |
|---|---|---|---|---|
| 5,075,679 A * | 12/1991 | Gazsi | | 341/143 |
| 5,369,404 A * | 11/1994 | Galton | | 341/143 |
| 5,568,142 A | 10/1996 | Velazquez et al. | | |
| 6,249,238 B1 | 6/2001 | Steinlechner | | |
| 6,359,576 B1 * | 3/2002 | Petrofsky | | 341/143 |
| 6,473,013 B1 | 10/2002 | Velazquez et al. | | |
| 6,518,905 B2 * | 2/2003 | Siferd | | 341/143 |
| 6,538,588 B1 * | 3/2003 | Bazarjani | | 341/143 |
| 6,577,259 B1 * | 6/2003 | Jelonnek | | 341/143 |
| 6,683,550 B2 | 1/2004 | Al-Awadhi | | |
| 6,771,198 B2 | 8/2004 | Azadet | | |
| 6,873,280 B2 | 3/2005 | Robinson et al. | | |
| 6,930,625 B1 * | 8/2005 | Lin | | 341/143 |
| 6,980,147 B2 | 12/2005 | Mathis et al. | | |
| 7,289,054 B1 | 10/2007 | Watanabe | | |
| 7,308,032 B2 * | 12/2007 | Capofreddi | | 375/247 |
| 7,324,036 B2 | 1/2008 | Petre et al. | | |
| 7,519,513 B2 | 4/2009 | Pupalaikis et al. | | |
| 7,535,394 B2 | 5/2009 | Pupalaikis | | |
| 7,548,179 B2 * | 6/2009 | Jalan | | 341/143 |
| 7,554,472 B2 * | 6/2009 | Puma | | 341/143 |
| 2008/0310200 A1 | 12/2008 | Maksimovic et al. | | |
| 2009/0066549 A1 * | 3/2009 | Thomsen et al. | | 341/143 |

(Continued)

OTHER PUBLICATIONS

Ortmans and Gerfers, "Continuous-Time Sigma-Delta A/D Conversion: Fundamentals, Performance Limits and Robust Implementations", ch. 3, Springer Berlin Heidelberg 2006.

(Continued)

*Primary Examiner* — Linh Nguyen
(74) *Attorney, Agent, or Firm* — Joseph G. Swan, P.C.

(57) ABSTRACT

Provided are, among other things, systems, methods and techniques for converting a continuous-time, continuously variable signal into a sampled and quantized signal. According to one representative embodiment, an apparatus includes multiple quantization-noise-shaping continuous-time filters, each in a separate processing branch and having an adder that includes multiple inputs and an output; an input signal is coupled to one of the inputs of the adder; the output of the adder is coupled to one of the inputs of the adder through a first filter; and the output of a sampling/quantization circuit in the same processing branch is coupled to one of the inputs of the adder through a second filter, with the second filter having a different transfer function than the first filter.

39 Claims, 25 Drawing Sheets

U.S. PATENT DOCUMENTS

2009/0135038 A1* 5/2009 Das .............................. 341/143
2011/0199246 A1* 8/2011 Kinyua ........................ 341/143

OTHER PUBLICATIONS

I. Galton and H. Jensen, "Delta Sigma Modulator Based A/D Conversion without Oversampling", IEEE Transactions on Circuits and Systems, vol. 42, 1995.

I. Galton and T Jensen, "Oversampling Parallel Delta-Sigma Modulator A/D Conversion", IEEE Transactions on Circuits and Systems, vol. 43, 1996).

Aziz, P., "Multi-band Oversampled Noise Shaping Analog to Digital Conversion" (PhD Thesis), University of Pennsylvania, 1996.

A. Beydoun and P. Benabes, "Bandpass/Wideband ADC Architecture Using Parallel Delta Sigma Modulators", 14th European Signal Processing Conference, 2006.

O. Shoaei, W. M. Snelgrove, "A Multi-Feedback Design for LC Bandpass Delta-Sigma Modulators", Proceedings—International Symposium on Circuits and Systems, vol. 1, 1995.

D. Anastassiou "Error Diffusion Coding in A/D Conversion," IEEE Transactions on Circuits and Systems, vol. 36, 1989.

Hoyos, Sebastian et al., "Analog to digital conversion of ultra-wideband signals in orthogonal spaces", IEEE Conference on Ultra Wideband Systems and Technologies, 2003, pp. 47-51.

Printout from http://www.eecg.toronto.edu/~kphang/ece1371/chap14_slides.pdf on Jul. 27, 2009.

Scott R. Velazquez, "High-Performance Advanced Filter Bank Analog-to-Digital Converter for Universal RF Receivers", Proceedings of the IEEE-SP International Symposium on Time-Frequency and Time-Scale Analysis, 1998. pp. 229-232.

Scott R. Velazquez et al., "Design of Hybrid Filter Banks for Analog/Digital Conversion", IEEE Transactions on Signal Processing, vol. 46, No. 4, Apr. 1998; pp. 956-967.

Scott R. Velazquez et al., "A hybrid filter bank approach to analog-to-digital conversion", Proceedings of the IEEE-SP International Symposium on Time-Frequency and Time-Scale Analysis (1994) pp. 116-119.

G. Ding et al., "Frequency-Interleaving Technique for High-Speed A/D Conversion", Proceedings of the 2003 International Symposium on Circuits and Systems, 2003, pp. 1-857-1-860.

P.P Vaidyanathan, "Analog/Digital Hybrid QMF Banks in A/D Conversion," Multirate Systems and Filter Banks, Englewood Cliffs, New Jersey: Prentice-Hall, 1993, pp. 163-164.

A. Petraglia and S.K. Mitra, "High-Speed A/D Conversion Using QMF Filter Banks," Proceeding IEEE International Symposium on Circuits and Systems, pp. 2797-2800, New Orleans, May 1990).

S.A. Jantzi, W.M. Snelgrove, and P.F. Ferguson Jr. "A Fourth-Order Bandpass Delta Sigma Modulator," IEEE Journal of Solid State Circuits, vol. 28, pp. 282-291, Mar. 1993.

Y. Matsuya, et. al. "A 16-bit Oversampling A-to-D Conversion Technology Using Triple-Integration Noise Shaping," IEEE Journal of Solid-State Circuits, vol. 22, pp. 921-929, Dec. 1987.

International Search Report and Written Opinion in corresponding PCT Application No. PCT/US2010/040115.

Eshraghi, A., et al., "A Comparative Analysis of Parallel Delta-Sigma ADC Architectures", IEEE Transactions on Circuits and Systems Part I: Regular Papers, vol. 51, No. 3, Mar. 1, 2004, pp. 450-458.

\* cited by examiner

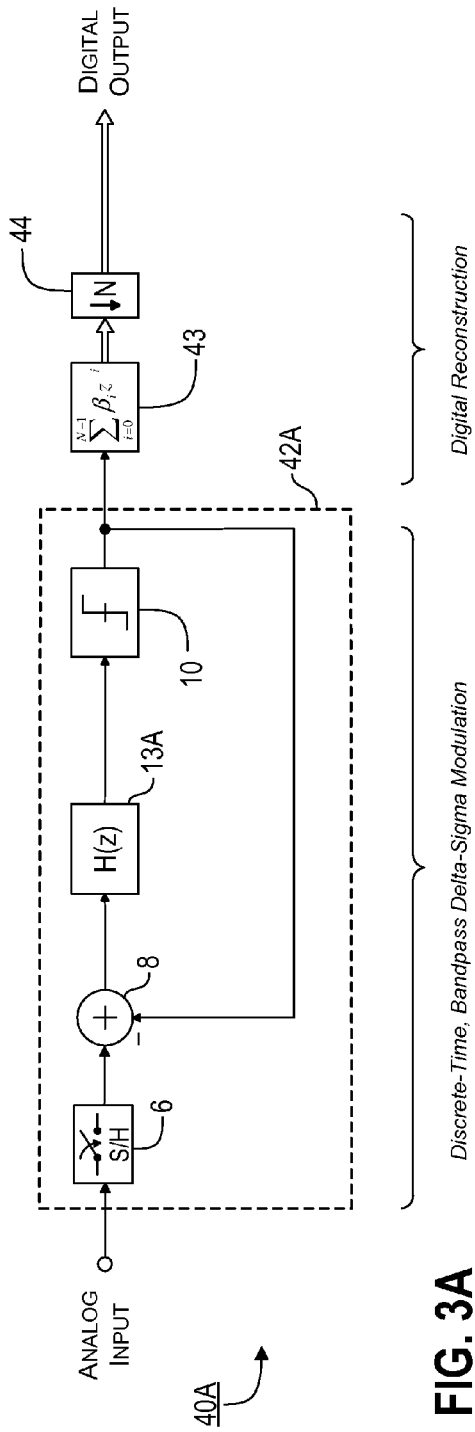
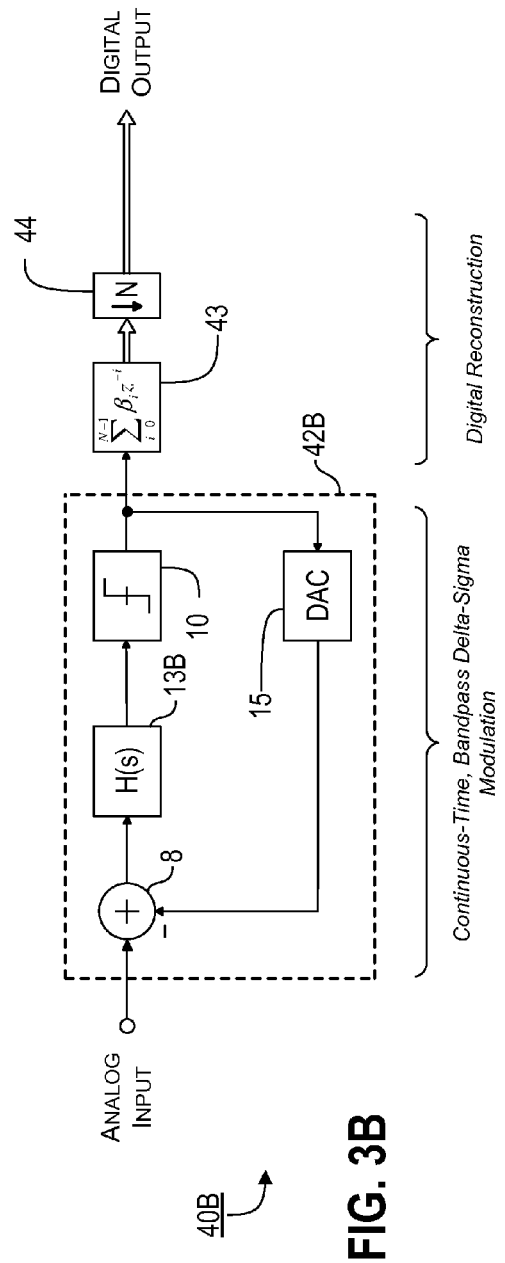
FIG. 3A
FIG. 3B

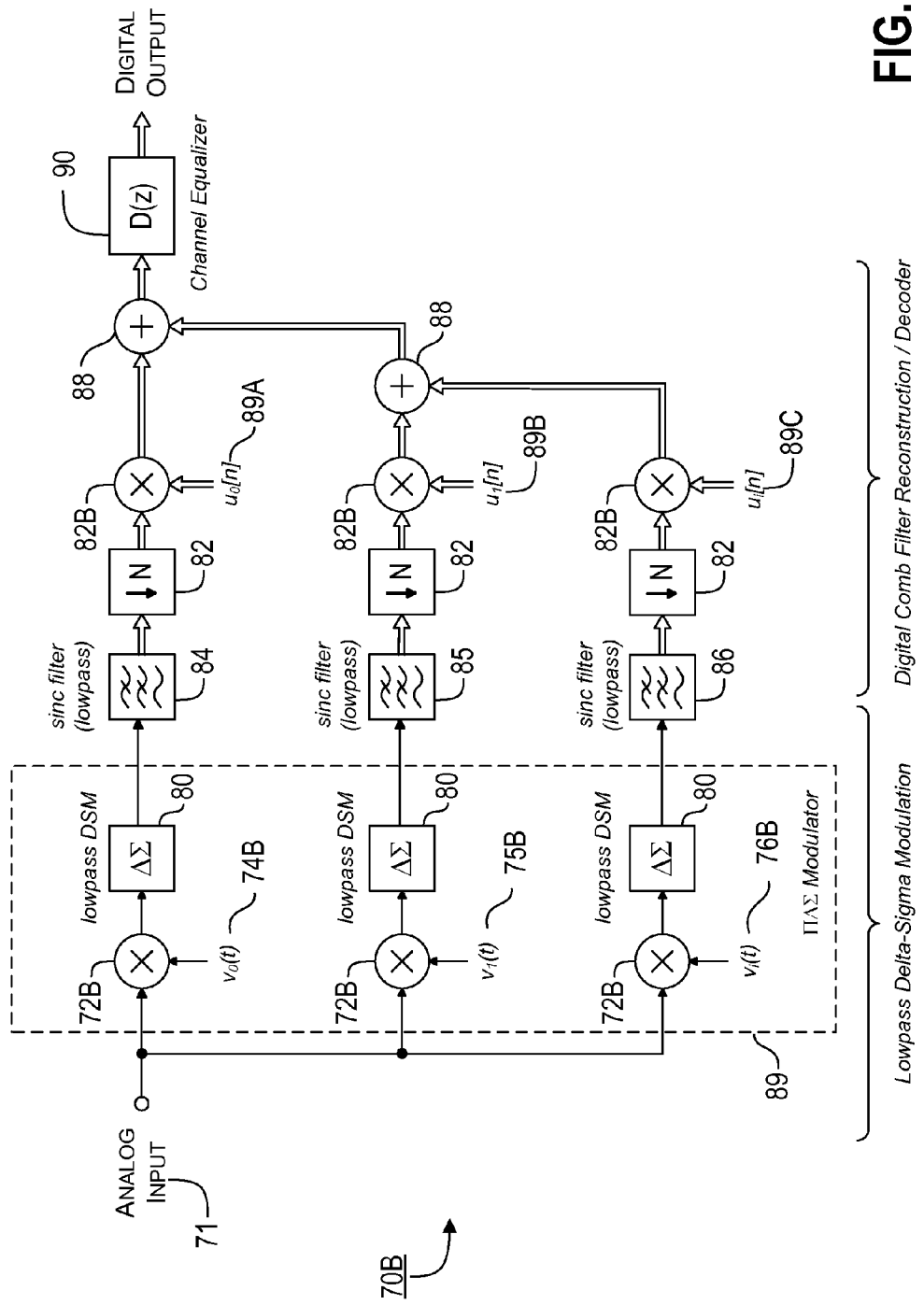

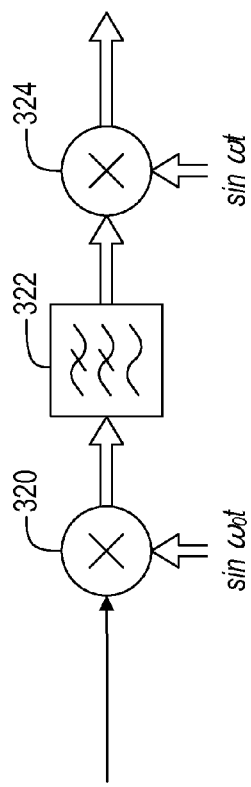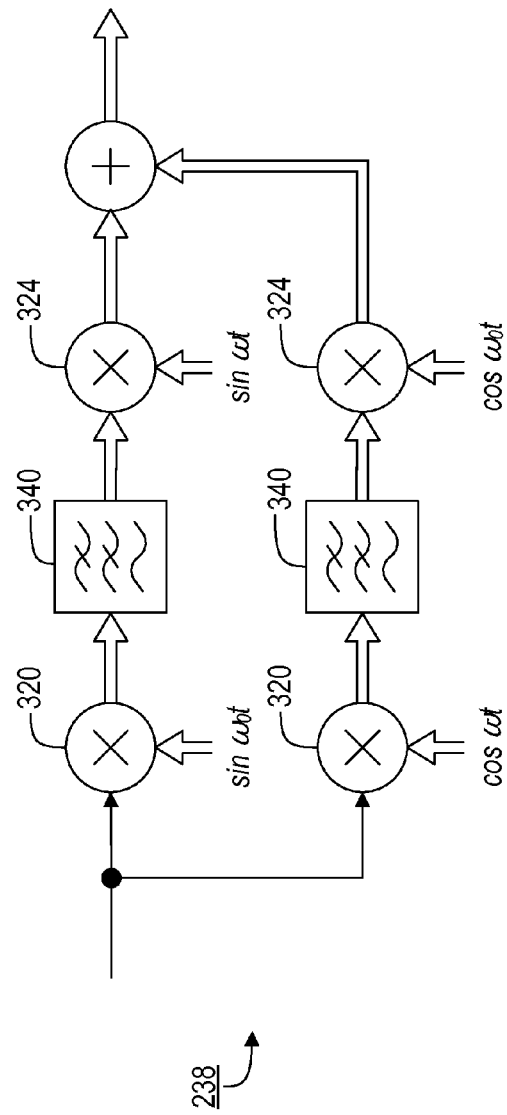
FIG. 13A (Prior Art)
FIG. 13B

SAMPLING/QUANTIZATION CONVERTERS

This application claims the benefit of U.S. Provisional Patent Application Ser. No. 61/221,009, filed on Jun. 26, 2009, and titled "Method of Linear to Discrete Signal Transformation using Orthogonal Bandpass Oversampling (OBO)", and U.S. Provisional Patent Application Ser. No. 61/290,817, filed on Dec. 29, 2009, and titled "Sampling/Quantization Converters". Both applications are incorporated by reference herein as though set forth herein in full.

FIELD OF THE INVENTION

The present invention pertains to systems, methods and techniques for converting a continuous-time continuously variable signal into a sampled, quantized discrete-time signal, and it is particularly applicable to very high sample-rate data converters with high instantaneous bandwidth.

BACKGROUND

Many applications in modern electronics require that continuous-time signals be converted to discrete signals for processing using digital computers and signal processors. Typically, this transformation is made using a conventional analog-to-digital converter (ADC). However, the present inventor has discovered that each of the presently existing approaches exhibits shortcomings that limit overall performance at very high sample rates.

Due to parallel processing and other innovations, the digital information processing bandwidth of computers and signal processors has advanced beyond the capabilities of state-of-the art ADCs. Converters with higher instantaneous bandwidth are desirable in certain circumstances. However, existing solutions are limited by instantaneous bandwidth (effective sample rate), effective conversion resolution (number of effective bits), or both.

The resolution of an ADC is a measure of the precision with which a continuous-time continuously variable signal can be transformed into a quantized signal, and typically is specified in units of effective bits. When a continuous-time continuously variable signal is converted into a discrete-time discretely variable signal through sampling and quantization, the quality of the signal degrades because the conversion process introduces quantization, or rounding, noise. High-resolution converters introduce less quantization noise because they transform continuously variable signals into discrete signals using a rounding operation with finer granularity. Instantaneous conversion bandwidth is limited by the Nyquist criterion to a theoretical maximum of one-half the converter sample rate (the Nyquist limit). High-resolution conversion (>10 bits) conventionally has been limited to instantaneous bandwidths of about a few gigahertz (GHz) or less.

Converters that quantize signals at a sample rate ($f_S$) that is at or slightly above a frequency equal to twice the signal bandwidth ($f_B$) with several or many bits of resolution are conventionally known as Nyquist-rate converters. Prior-art Nyquist-rate converter architectures include conventional flash and conventional pipeline analog-to-digital converters (ADCs). Conventional flash converters potentially can achieve very high instantaneous bandwidths. However, the resolution of flash converters can be limited by practical implementation impairments that introduce quantization errors, such as clock jitter, thermal noise, and rounding/gain inaccuracies caused by component tolerances. Although flash converters potentially could realize up to 9 bits of resolution at instantaneous information bandwidths greater than 10 GHz, this potential has been unrealized in commercial offerings. Conventional pipeline converters generally have better precision than commercial flash converters, because they employ complex calibration schemes to reduce the quantization errors caused by these practical implementation impairments. However, pipeline converters typically can provide less than about 1 GHz of instantaneous bandwidth.

Another conventional approach that attempts to reduce quantization noise and errors uses an oversampling technique. Oversampling converters sample and digitize continuous-time, continuously variable signals at a rate much higher than twice the analog signal's bandwidth (i.e., $f_S \gg f_B$). Due to operation at very high sample rates, the raw high-speed converters used in oversampling approaches ordinarily are capable of only low-resolution conversion, often only a single bit. Conventional oversampling converters realize high resolution by using a noise-shaping operation that ideally attenuates quantization noise and errors in the signal bandwidth, without also attenuating the signal itself. Through quantization noise shaping and subsequent filtering (digital signal reconstruction), oversampling converters transform a high-rate, low-resolution output into a low-rate, high-resolution output.

FIGS. 1A-C illustrate block diagrams of conventional, lowpass oversampling converters. A typical conventional oversampling converter uses a delta-sigma modulator (DSM) 7A-C to shape or color quantization noise. As the name implies, a delta-sigma modulator 7A-C shapes the noise that will be introduced by quantizer 10 by performing a difference operation 8 (i.e., delta) and an integration operation 13A-C (i.e., sigma), e.g., $$H(z) = \frac{z^{-1}}{1-z^{-1}}.$$

Generally speaking, the delta-sigma modulator processes the signal with one transfer function (STF) and the quantization noise with a different transfer function (NTF). Conventional transfer functions are of the form STF(z)=1 and NTF(z)=$(1-z^{-1})^P$, where $z^{-1}$ represents a unit delay equal to $T_S=1/f_S$, and P is called the order of the modulator or noise-shaping response. The noise transfer function has a frequency response given by NTF($e^{-sT}$)=$(1-e^{-sT_S})^P$. The STF frequency response 30 and NTF frequency response 32 for P=1 are shown in FIG. 2.

There exist various types of conventional delta-sigma modulators that produce equivalent signal and noise transfer functions. A delta-sigma modulator that employs an auxiliary sample-and hold operation, either explicitly as in sample-and-hold circuit 6 in filters 5A&C shown in FIGS. 1A&C, respectively, or implicitly using switched-capacitor circuits, for example, is commonly referred to as a discrete-time, delta-sigma modulator (DT DSM). A delta-sigma modulator that does not employ a sample-and-hold operation, such as filter 7B shown in FIG. 1B, is commonly referred to as a continuous-time, delta-sigma modulator (CT DSM). Discrete-time modulators have been the preferred method in conventional converters because DT DSMs are more reliable in terms of stable (i.e., insensitivity to timing variations) and predictable (i.e., linearity) performance. See Ortmans and Gerfers, "Continuous-Time Sigma-Delta A/D Conversion: Fundamentals, Performance Limits and Robust Implementations", Springer Berlin Heidelberg 2006. The converters 5A&B, shown in FIGS. 1A&B, respectively, employ delta-sigma modulators with filtering 13A&B in the feed-forward path from the output of the modulator adder 8 to the input of the quantizer 10, in an arrangement known as an interpolative structure. An alternative is the error-feedback structure of converter 5C shown in FIG. 1C, which has no feed-forward filtering. It does not appear that the conventional error-feedback modulator has any performance or implementation advantage relative to the interpolative (feed-forward) structure, which is the preferred method in conventional continuous-time converters.

As illustrated in FIGS. 1A-C, conventional oversampling converters employ a comb or sinc filter 12 for quantization noise filtering and signal reconstruction. Conventional oversampling converters with first-order nosie shaping realize the comb filter 12 in three steps: second-order integration 12A, e.g., with a transfer function of $$\frac{1}{(1-z^{-1})^2}$$

at the converter sample rate ($f_S$ or $f_{CLK}$), followed by downsampling 12B at the converter oversampling ratio (N), followed by second-order differentiation 12C, e.g., with a transfer function of $$(1-z^{-1})^2$$

at the converter output rate. A generalized comb filter transfer function of $$F(z) = \left(\frac{1-z^{-2N}}{1-z^{-1}}\right)^{P+1},$$

where P is the order of the modulator, produces local minima at multiples of the output data rate, and conventionally has been considered optimal for oversampling converters. Thus, in the specific example given above, it is assumed that a modulator with first-order response is used.

The delta-sigma converters 5A-C illustrated in FIGS. 1A-C are conventionally known as lowpass, delta-sigma converters. A variation on the conventional lowpass converter, employs bandpass delta-sigma modulators to allow conversion of narrowband signals that are centered at frequencies above zero. Exemplary bandpass oversampling converters 40A&B, illustrated in FIGS. 3A&B, respectively, include a bandpass delta-sigma modulator 42A or 42B, respectively, that provides, as shown in FIG. 4, a signal response 70 and a quantization-noise response 71 with a minimum 72 at the center of the converter Nyquist bandwidth (i.e., $f_S/4$). After single-bit high-speed quantization/sampling 10 (or, with respect to converter 40A shown in FIG. 3A, just quantization, sampling having been performed in sample-and-hold circuit 6), quantization noise filtering 43, similar to that performed in the standard conventional lowpass oversampling converter (e.g., any of converters 5A-C), is performed, followed by downsampling 44.

Bandpass delta-sigma modulators are similar to the more-common lowpass variety in several respects: The conventional bandpass delta-sigma modulator has both discrete-time (converter 40A shown in FIG. 3A) and continuous-time (converter 40B shown in FIG. 3B) forms. Like the lowpass version, the bandpass delta-sigma modulator 42A&B shapes noise from quantizer 10 by performing a difference operation 8 (i.e., delta) and an integration operation 13A&B (i.e., sigma), respectively, where $$H(z) = \frac{z^{-1}}{1-z^{-1}}$$

and $$H(s) = \frac{As}{s^2+\omega^2}.$$

Also, the bandpass modulator processes the signal with one transfer function (STF) and the quantization noise with a different transfer function (NTF). Conventional transfer functions are of the form STF(z)=1 and NTF(z)=$(1+\alpha \cdot z^{-1}+z^{-2})^P$, where $z^{-1}$ represents a unit delay equal to $T_S$ and P is the modulator noise-shaping order.

As shown above, the noise transfer function (NTF) of a real bandpass delta-sigma modulator is at minimum a second-order response. The modulator coefficient, $\alpha$, determines the location of a spectral notch ($f_{notch}$), or null, in the noise transfer function frequency response according to NTF $(e^{-sT})=(1-\alpha \cdot e^{-sTs}+z^{-2sTs})$. The frequency of $f_{notch}$ typically is set to coincide with the center of the input signal bandwidth. Quantization noise minima are placed at arbitrary locations in the converter band by allowing the modulator coefficient, $\alpha$, to vary continuously over a range of −2 to +2, such that $\alpha=-2\cdot\cos(2\cdot\pi f_{notch}\cdot T_S)$. A bandpass delta-sigma modulator is equivalent to a second-order, lowpass delta-sigma modulator when $\alpha=-2$ because NTF(z)=$(1-2\cdot z^{-1}+z^{-2})=(1-z^{-1})^2$.

Conventional oversampling converters can offer very high resolution, but the noise filtering and signal reconstruction process generally limits the utility of oversampling converters to applications requiring only low instantaneous bandwidth. To improve the instantaneous bandwidth of oversampling converters, multiple oversampling converters can be operated in parallel using the time-interleaving (time-slicing) and/or frequency-interleaving (frequency-slicing) techniques developed originally for Nyquist converters (i.e., flash, pipeline, etc.). In time-interleaving, a high-speed sample clock is decomposed into lower-speed sample clocks at different phases. Each converter in the time-interleaved array is clocked with a different clock phase, such that the conversion operation is distributed in time across multiple converters. While converter #1 is processing the first sample, converter #2 is processing the next sample, and so on.

In frequency interleaving, the total bandwidth of the continuous-time signal is divided into multiple, smaller sub-bands. According to one representative implementation of a frequency interleaving ADC 70A, shown in FIG. 5A, the individual bands are separated out and down-converted to baseband. More specifically, the input signal 71 is provided to a set of multipliers 72 together with the band's central frequencies 74A-76A. The resulting baseband signals are then provided to lowpass, anti-aliasing filters 78. Each such filtered baseband signal is then digitized 80A, digitally upconverted (or upsampled) 82A using digitized sinusoids 83A-C and then bandpass filtered 84A-86A in order to restore it to its previous frequency band. Finally, the individual bands are recombined in one or more adders 88. Each converter 80A in the interleaved array is able to operate at a submultiple of the overall sample rate, due to the reduced signal bandwidth in each of the subdivided, down-converted bands.

The conventional parallel delta-sigma analog-to-digital converter (ΠΔΣADC) 70B, shown in FIG. 5B, is similar in design and operation to the conventional frequency-interleaved converter 70A shown in FIG. 5A, except that oversampling converters 80B are used in place of multi-bit digitizers 80A and anti-aliasing filters 78. See I. Galton and H. Jensen, "Delta Sigma Modulator Based A/D Conversion without Oversampling", IEEE Transactions on Circuits and Systems, Vol. 42, 1995 and I. Galton and T Jensen, "Oversampling Parallel Delta-Sigma Modulator A/D Conversion", IEEE Transactions on Circuits and Systems, Vol. 43, 1996). As shown in FIG. 5B, the primary advantage of the prior-art ΠΔΣ converter 70B is that the oversampling operation of the delta-sigma modulators 89 eliminates the need for the anti-aliasing function provided by the analog filter bank. The conventional ΠΔΣADC generally employs discrete-time, lowpass delta-sigma modulators 89 and uses continuous-time Hadamard sequences ($v_i(t)$) 74B-76B and discrete-time Hadamard sequences ($u_i[n]$) 89A-C, instead of sinusoidal waveforms, to reduce the circuit complexity associated with the downconversion 72B and upconversion 82B operations. In some instances, bandpass delta-sigma modulators are used to eliminate the need for analog downconversion completely, in a process sometimes called Direct Multi-Band Delta-Sigma Conversion (MBΔΣ). See Aziz, P., "Multi-band Oversampled Noise Shaping Analog to Digital Conversion" (PhD Thesis), University of Pennsylvania, 1996 and A. Beydoun and P. Benabes, "Bandpass/Wideband ADC Architecture Using Parallel Delta Sigma Modulators", 14th European Signal Processing Conference, 2006. In addition to multi-band delta-sigma modulation, conventional frequency-interleaved, oversampling converters (i.e., ΠΔΣADC and MBΔΣ) employ conventional comb$^{P+1}$ (ΠΔΣADC) filters or conventional filter bank (MBA) signal reconstruction schemes.

The present inventor has discovered that conventional ΠΔΣ converters, as shown in FIG. 5B, and conventional MBΔΣ converters have several disadvantages that limit their utility in applications requiring very high instantaneous bandwidth and high resolution. These disadvantages, which are discussed in greater detail in the Description of the Preferred Embodiment(s) section, include: (1) use of delta-sigma modulation (Galton, Aziz, and Beydoun) impairs high-frequency operation because the sample-and-hold operation limits the performance of DT DSMs and non-ideal circuit behavior can degrade the noise-shaping response and stability of CT DSMs; (2) use of comb filters for signal reconstruction in ΠΔΣ converters (Galton) introduces amplitude and phase distortion that is not completely mitigated by the output equalizer (i.e., equalizer 90 having transfer function D(z) in FIG. 5B); (3) use of Hadamard sequences for downconversion and upconversion in ΠΔΣ converters introduces conversion errors related to signal-level mismatches and spectral images; (4) use of conventional filter-bank technology (as in Aziz) or Hann window filters (as in Beydoun) for signal reconstruction in MBA converters limits the practical number of parallel processing branches/channels due to signal-processing complexities (i.e., number of multiply/accumulates), particularly for high-frequency, multi-rate (i.e., polyphase) filter topologies; and (5) absence of feedback from the signal-reconstruction filter outputs to the DSM, means that DSM component tolerances can degrade converter performance by creating mismatches between the notch frequency ($f_{notch}$) in the NTF and the center frequency of the narrowband reconstruction filter response. Possibly due to these disadvantages, the instantaneous bandwidth and resolution performance of conventional ΠΔΣ and MBΔΣ converters have not been able to surpass that of conventional pipeline converters.

In addition to ΠΔΣ and MBΔΣ, parallel arrangements of delta-sigma modulators are the subject of several United States patents, such as U.S. Pat. Nos. 7,289,054, 6,873,280, and 6,683,550. However, these patents generally fail to adequately address the primary issues associated with the high-resolution, high-sample-rate conversion of continuous-time signals to discrete-time signals. One technique, described in U.S. Pat. No. 7,289,054, uses digitization of noise-shaping-filter residues for increasing converter precision, rather than using reconstruction filter banks for quantization noise reduction. Another technique, described in U.S. Pat. No. 6,873,280, addresses conversion of digital (discrete-time, discretely variable) signals to other forms, rather than the conversion of analog (continuous-time, continuously variable) signals to digital signals. A third technique, described in U.S. Pat. No. 6,683,550, employs multi-bit, first-order modulators which are not suitable for high-precision, bandpass oversampling applications since these application require modulators that are at least second order.

SUMMARY OF THE INVENTION

The present invention provides an improved ADC, particularly for use at very high sample rates and instantaneous bandwidths approaching the Nyquist limit.

Thus, one embodiment of the invention is directed to an apparatus for converting a continuous-time, continuously variable signal into a sampled and quantized signal. The apparatus includes: an input line for accepting an input signal that is continuous in time and continuously variable; a plurality of processing branches coupled to the input line; and an adder coupled to outputs of the plurality of processing branches, with each of the processing branches including: (a) a quantization-noise-shaping continuous-time filter, (b) a sampling/quantization circuit coupled to an output of the quantization noise-shaping continuous-time filter, (c) a digital bandpass filter coupled to an output of the sampling/quantization circuit, and (d) a line coupling the output of the sampling/quantization circuit back into the quantization-noise-shaping continuous-time filter. Each of the quantization-noise-shaping continuous-time filters has an adder that includes multiple inputs and an output, with the input signal being coupled to one of the inputs of the adder, the output of the adder being coupled to one of the inputs of the adder through a first filter, the output of the sampling/quantization circuit in the same processing branch being coupled to one of the inputs of the adder through a second filter, and the second filter having a different transfer function than the first filter. The quantization-noise-shaping continuous-time filters in different ones of the processing branches have quantization noise minima at different frequencies, and the quantization noise minimum for each of the quantization-noise-shaping continuous-time filters corresponds to a frequency band selected by the digital bandpass filter in the same processing branch.

Such an apparatus typically can provide a better combination of high resolution and wide bandwidth than is possible with conventional converters and can be used for various commercial, industrial and military applications, e.g., in various all-digital communication receivers, all-digital RADAR systems, high-speed digital acquisition systems.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 3A is a block diagram of a single-band bandpass oversampling converter having a discrete-time, interpolative delta-sigma modulator with second-order response; and FIG. 3B is a block diagram of a single-band bandpass oversampling converter having a continuous-time, interpolative delta-sigma modulator with second-order response.

FIG. 5B is a block diagram of a conventional parallel delta-sigma modulator converter (ΠΔΣADC).

FIG. 13A is a block diagram illustrating a conventional structure for implementing bandpass filtering using frequency downconversion followed by lowpass filtering followed by frequency upconversion; and FIG. 13B is a block diagram of a Moving Average Reconstruction (MAR) bandpass filter.

DESCRIPTION OF THE PREFERRED EMBODIMENT(S)

A preferred converter according to the present invention uses a technique that sometimes is referred to herein as Multi-Channel Bandpass Oversampling (MBO). Such a technique shares some structural similarities with conventional parallel delta-sigma (ΠΔΣ) and multi-band delta-sigma (MBΔΣ) analog-to-digital converters, in that the MBO converter also consists of multiple, parallel, oversampling converters. However, an MBO converter according to the preferred embodiments of the present invention incorporates one or more of the following technological innovations to improve instantaneous bandwidth and resolution: (1) continuous-time, Diplexed Feedback Loops (DFLs) are used in place of delta-sigma modulators, e.g., to improve quantization noise shaping at very high converter sample rates; (2) bandpass (preferably second-order or higher) oversampling eliminates the need for analog downconversion using sinusoidal waveforms or Hadamard sequences (e.g., as in ΠΔΣ converters); (3) Moving Average Reconstruction (MAR) filters are used in place of comb filters (i.e., ΠΔΣ), conventional filter banks (i.e., MBΔΣ), or Hann window filters to minimize phase and amplitude distortion and significantly reduce signal-processing complexity; and/or (4) active noise-shaping filter calibration is employed to reduce conversion performance losses caused by mismatches between the notch frequencies ($f_{notch}$) the noise-shaping filter (preferably, a DFL filter) notch, of and the center frequencies of the signal reconstruction (preferably MAR bandpass) filters. Such techniques can in some respects be thought of as a unique and novel method of combining two distinct conventional techniques—continuous-time, bandpass oversampling and multi-channel, frequency-interleaving. As discussed in more detail below, the use of such techniques often can overcome the problems of limited conversion resolution and precision at very high instantaneous bandwidths.

Figure 1A:
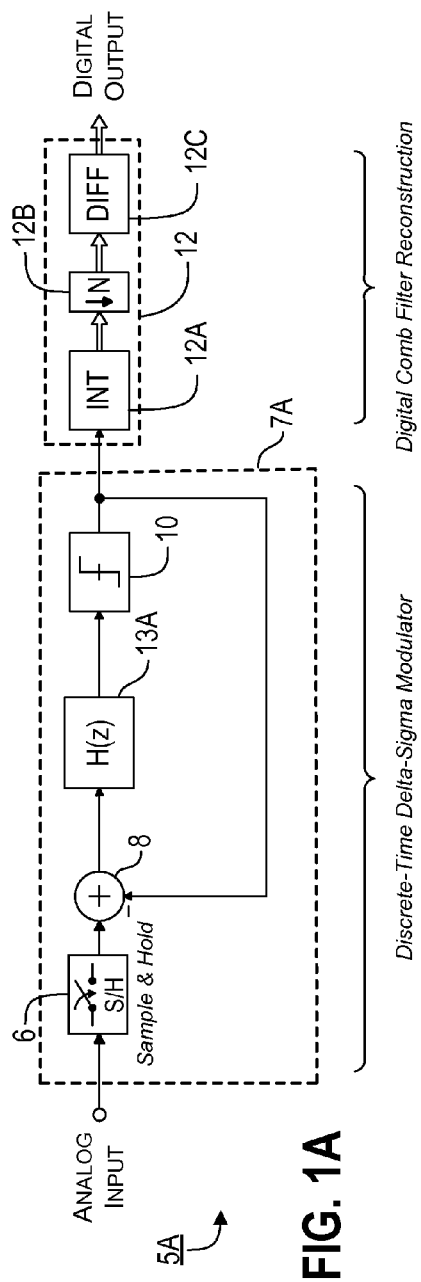
FIG. 1A is a block diagram of a conventional oversampling converter having a discrete-time, interpolative delta-sigma modulator with first-order response.
Figure 2:
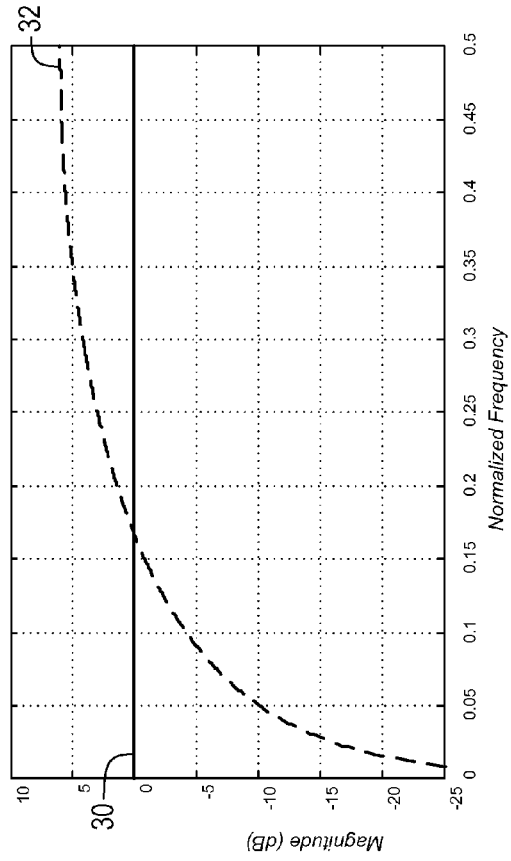
FIG. 2 illustrates the input signal and quantization-noise transfer functions for a conventional, first-order delta-sigma modulator.
Figure 1B:
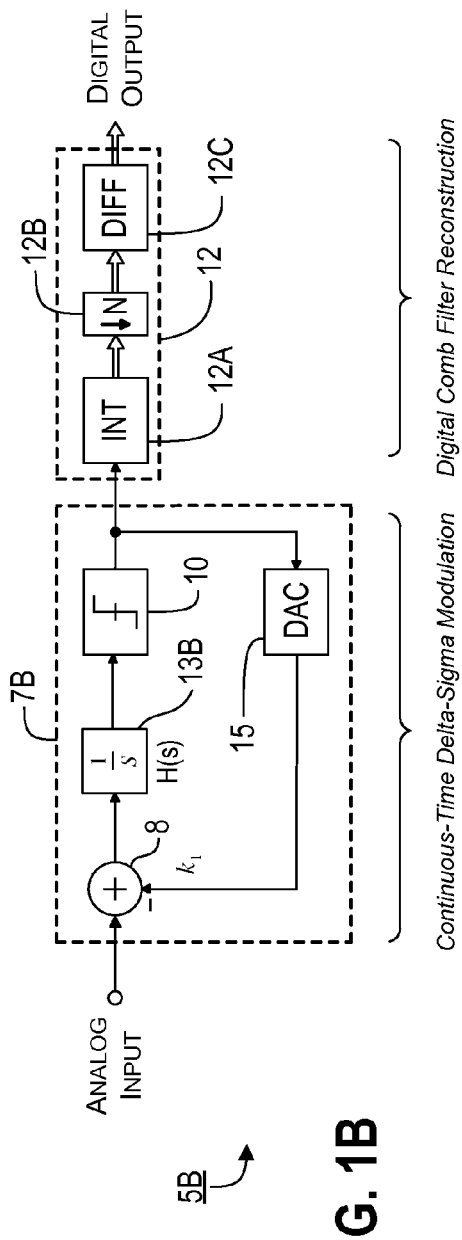
FIG. 1B is a block diagram of a conventional oversampling converter having a continuous-time, interpolative delta-sigma modulator with first-order response.
Figure 1C:
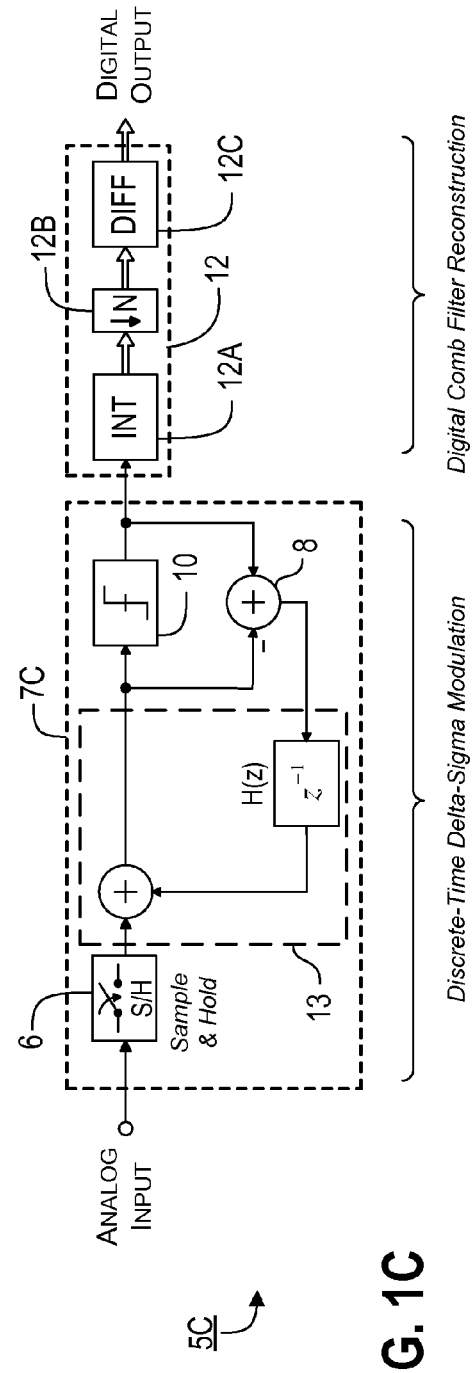
FIG. 1C is a block diagram of a conventional oversampling converter having a discrete-time, error-feedback delta-sigma modulator filter with first-order response.
Figure 4:
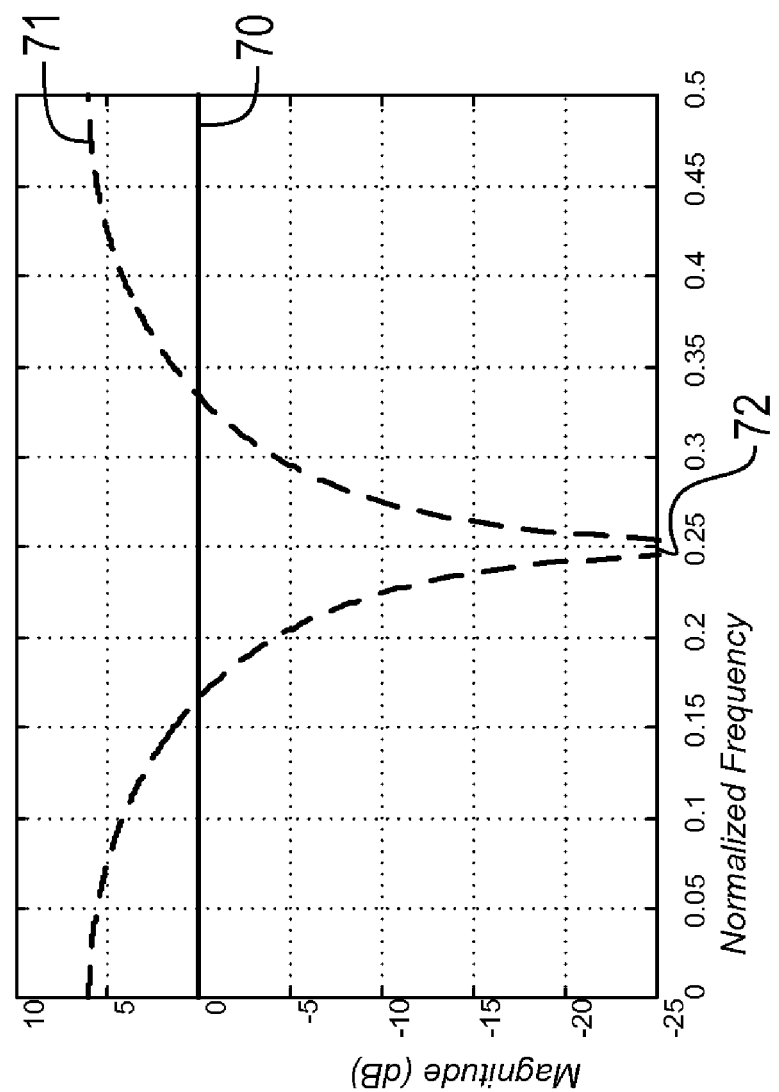
FIG. 4 illustrates the input signal and quantization-noise transfer functions for the delta-sigma modulator of the single-band bandpass converters shown in FIGS. 3A&B.
Figure 5A:
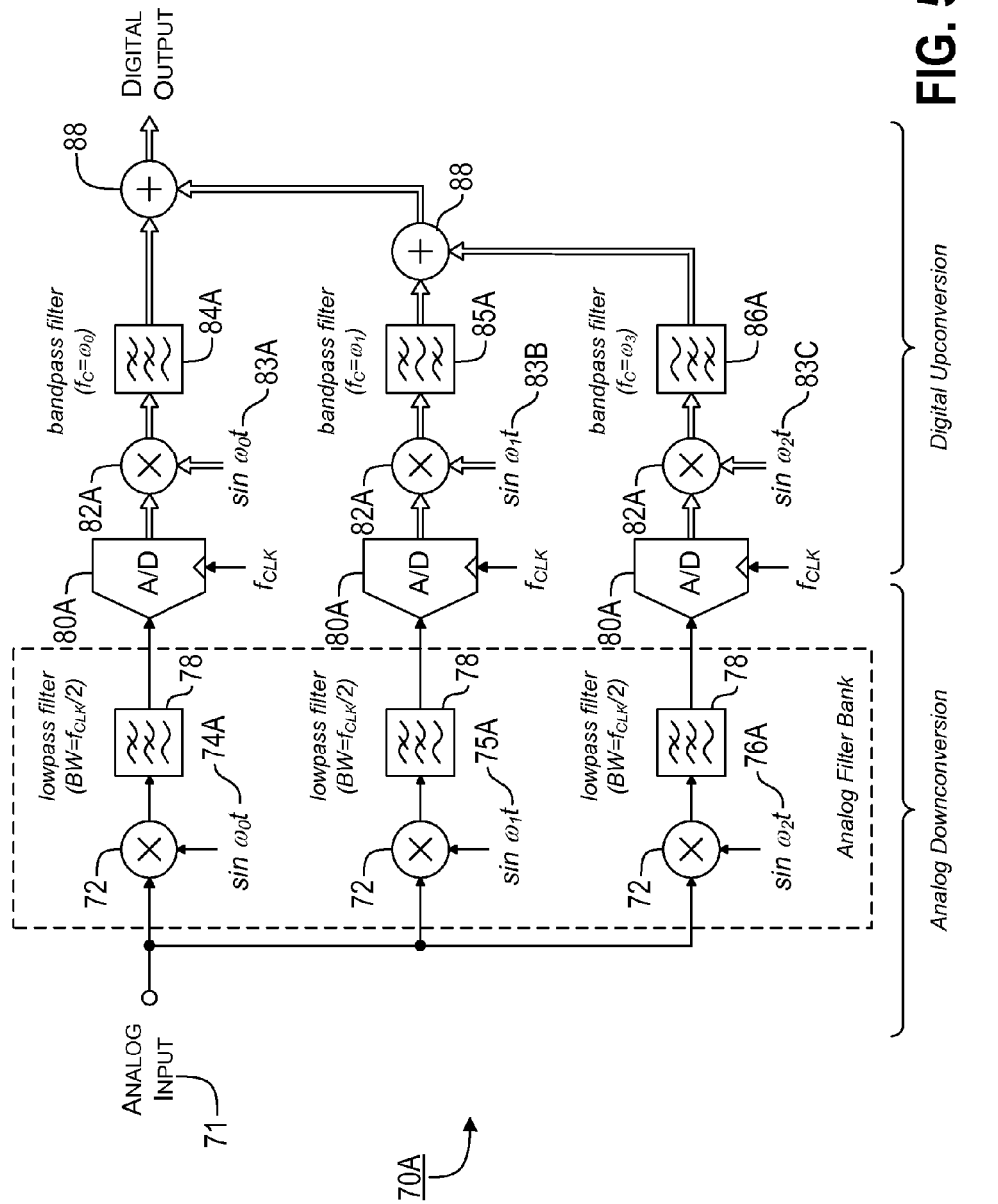
FIG. 5A is a block diagram of a conventional frequency-interleaving converter.
Figure 6:
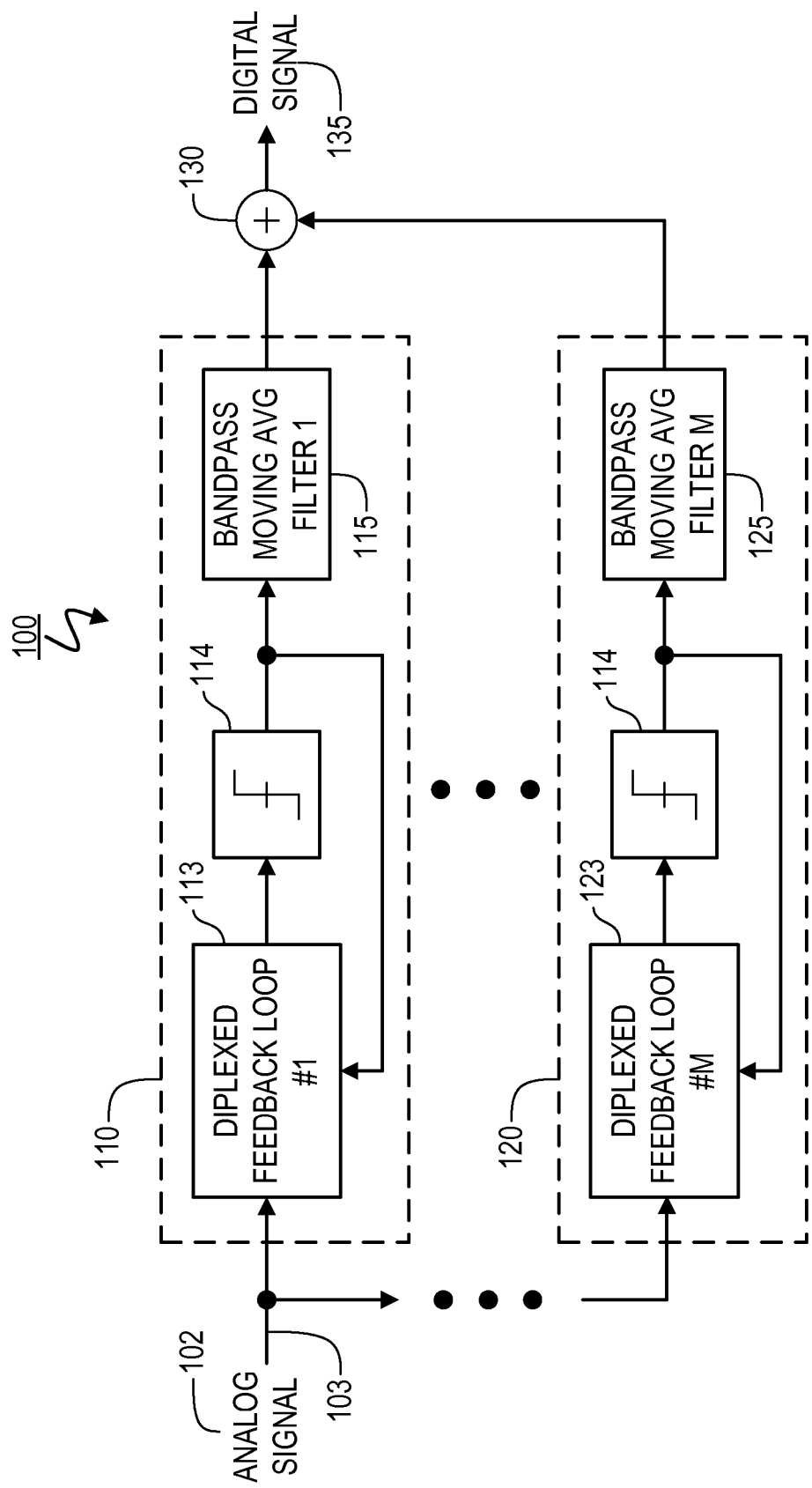
FIG. 6 is a simplified block diagram of a multi-channel bandpass oversampling converter according to a representative embodiment of the present invention.

A simplified block diagram of one converter 100 according to the preferred embodiments of the present invention is illustrated in FIG. 6. In the preferred embodiments, converter 100 separately processes M different frequency bands for a continuous-time continuously variable signal 102, using a separate branch (e.g., branch 110 or 120) to process each such band, and then sums up all the branch outputs in an adder 130 in order to provide the output digital signal 135. In one embodiment of the invention, the M different frequency bands are orthogonal, or at least approximately orthogonal, with respect to the converter output data rate. More specifically, the signal 102 is input on a line 103 that could be implemented, e.g., as a physical port for accepting an external signal or as an internal wire, conductive trace or a similar conductive path for receiving a signal from another circuit within the same device. In the present embodiment, the input signal 102 is provided directly to each of the branches (e.g., branches 110 and 120). However, in alternate embodiments the input line 103 can be coupled to such branches in any other manner. As used herein, the term "coupled", or any other form of the word, is intended to mean either directly connected or connected through one or more other processing blocks, e.g., for the purpose of preprocessing. It should also be noted that any number of branches may be used and, as discussed in more detail below, increasing the number of branches generally increases the resolution of the converter 100.

In any event, in the present embodiment each such branch (e.g., branch 110 or 120) primarily processes a different frequency channel and includes: a Diplexed Feedback Loop (DFL) or other quantization-noise-shaping filter (e.g., filter 113 or 123), a sampling/quantization circuit 114, and a Moving Average Reconstruction filter or other bandpass reconstruction filter (e.g., filter 115 or 125). Each quantization-noise-shaping filter (e.g., DFL filter 113 or 123) has a quantization noise response with a minimum (i.e., notch or null) at or near the frequency band(s) (more preferably, the center of the frequency band(s)) that is/are intended to be processed by its respective branch. Each sampling/quantization circuit 114 preferably is identical to the others and is implemented as a single-bit quantizer, sometimes referred to herein as a hard limiter.

As discussed in greater detail below, the signal input into sampling/quantization circuit 114 and the signal output by sampling/quantization circuit 114 preferably are fed back, diplexed (i.e., independently filtered, combined, and then optionally jointly filtered), and combined with the input signal 102 so that quantization errors in earlier samples can be taken into account in generating later quantized samples. Each digital bandpass filter, preferably a Moving Average Reconstruction filter (e.g., filter 115 or 125), selects out the frequency band being processed within its respective branch. The adder 130 can be implemented, e.g., as a single adder with multiple inputs or as a series of two-input adders.

Use of a hard limiter for the sampling/quantization circuits 114 generally is preferred because, due to its simplicity, a hard limiter usually allows for the maximum possible sampling rate and is not as subject to differential nonlinearities or quantization errors (as opposed to quantization noise) associated with multi-bit quantizers. However, use of multi-bit quantizers potentially can improve converter resolution at the expense of instantaneous bandwidth. In the preferred embodiments, the sampling rate of the individual sampling/quantization circuits 114 is the sampling rate for the converter 100 as a whole, meaning that no downsampling is performed, although in alternate embodiments it might be desirable to perform some (e.g., limited, such as by a factor of no more than 2 or 4) downsampling. At the same time, a desired overall effective resolution of the converter 100 generally can be achieved, independent of the sampling rate, by appropriately selecting design parameters such as the number of branches (corresponding to the number of individual frequency bands processed) and the quality of the filters used.

Noise-Shaping Filter Considerations

In the embodiment described above, each of the noise-shaping filters is a DFL filter because such a filter has been found to achieve the best combination of effectiveness, ease of construction and ease of configuration. However, it should be noted that it is possible to use other kinds of noise-shaping filters in alternate embodiments of the invention. In any event, the primary considerations for the noise-shaping filters to be used preferably derive from the desire for stable and accurate operation at very high sample rates. Therefore, each noise-shaping circuit according to the preferred embodiments has at least the following three properties: (1) the primary performance impairments of the noise-shaping filter, such as those related to settling-time errors, sampling uncertainty/jitter, and quantization/rounding errors, are subject to noise shaping; (2) the performance of the noise-shaping circuit is relatively insensitive to non-ideal circuit behavior and excess feedback loop delay; and (3) the noise-shaping circuit can be implemented using high-frequency design techniques, such as those utilizing distributed-element circuits and monolithic microwave integrated circuits (MMICs). Achieving these properties generally precludes the use of conventional delta-sigma modulators for the noise-shaping operation.

For instance, the conventional DT DSM is not suitable for use in the MBO converter because the auxiliary sample-and-hold operation of the DT DSM introduces impairments, such as settling-time errors and sampling uncertainty/jitter, that are not subject to noise shaping and, therefore, that limit the performance of the DT DSM at high frequencies. In addition, the operating frequency of the DT DSM is limited by the sampling speed of the auxiliary, high-precision sample-and-hold operation.

The conventional CT DSM is not suitable for use in the MBO converter because, although the impairments of the single, coarse sampling operation can be subject to noise shaping, the feed-forward filtering of the conventional CT DSM generally requires high-gain, transconductance stages (i.e., current sources), high-gain operational amplifiers (i.e., voltage sources), and/or high-quality (Q), lumped-element parallel resonators (i.e., discrete inductors and capacitors). Although a continuous-time noise-shaping circuit can operate at higher frequencies than the DT DSM, due to the absence of an auxiliary sample-and-hold operation, the performance of CT DSM implementations is limited by the non-ideal behavior of the active and reactive lumped circuit elements that comprise the continuous-time filter in the modulator feed-forward path, particularly when operating at very high sample rates. At very high frequencies, such as microwave frequencies, lumped-element devices instead behave like distributed-element devices: the output impedance degradation of transconductance stages and operational amplifiers causes them to behave less like current sources and more like basic amplifiers (i.e., power output versus current or voltage output); and the parasitic impedances of reactive components, like inductors and capacitors, cause them to behave like low-Q series or parallel resonators. Still further, the non-ideal behavior of lumped circuit elements degrades the bandwidth of the feed-forward filter and thereby limits the operating frequency of the CT DSM.

Another problem with the CT DSM is that the excess loop delay introduced by the finite settling time of the feedback DAC degrades noise-shaping performance and stability by increasing the order of an interpolative modulator. The conventional solution to this problem is to bring multiple feedback paths into the continuous-time, feed-forward filter using DACs that produce different output waveforms, such as non-return-to-zero (NRZ), return-to-zero (RZ) and half-delayed return-to-zero (HRZ) pulses. See O. Shoaei, W. M. Snelgrove, "A Multi-Feedback Design for LC Bandpass Delta-Sigma Modulators", Proceedings—International Symposium on Circuits and Systems, Vol. 1, 1995. However, at very high sampling frequencies, this solution only aggravates existing performance limitations related to the non-ideal behavior of the active and reactive lumped circuit elements comprising the feed-forward filter.

Instead, the present inventor has discovered a new technique for quantization noise shaping, referred to herein as a Diplexed Feedback Loop (DFL), that, compared to conventional delta-sigma modulators, incorporates several significant technological innovations to improve operating frequency and performance stability. First, the DFL operates as a continuous-time circuit (i.e., processing continues-time continuously variable signals), as opposed to a discrete-time circuit. Thus, there is no high-precision, auxiliary sample-and-hold operation that limits speed and accuracy. Second, the DFL can be configured for bandpass (e.g., second-order or higher) noise shaping or for lowpass noise shaping. Thus, the DFL noise shaper has utility in converter applications where the input signal is not centered at zero frequency. Third, the DFL employs passive feedback filter structures that produce quantization noise notches at pre-selected frequencies, but are relatively insensitive to excess feedback loop delay. These passive filters are capable of high-frequency operation because they can be implemented using distributed-element and microwave design techniques. Fourth, the DFL can employ tunable feedback elements for dynamic calibration of the quantization noise response. Thus, the performance of the noise shaper can be made significantly less sensitive to component or manufacturing tolerances. For these reasons, among others, the preferred embodiment of the MBO converter uses the DFL approach for quantization noise shaping.

Figure 7:
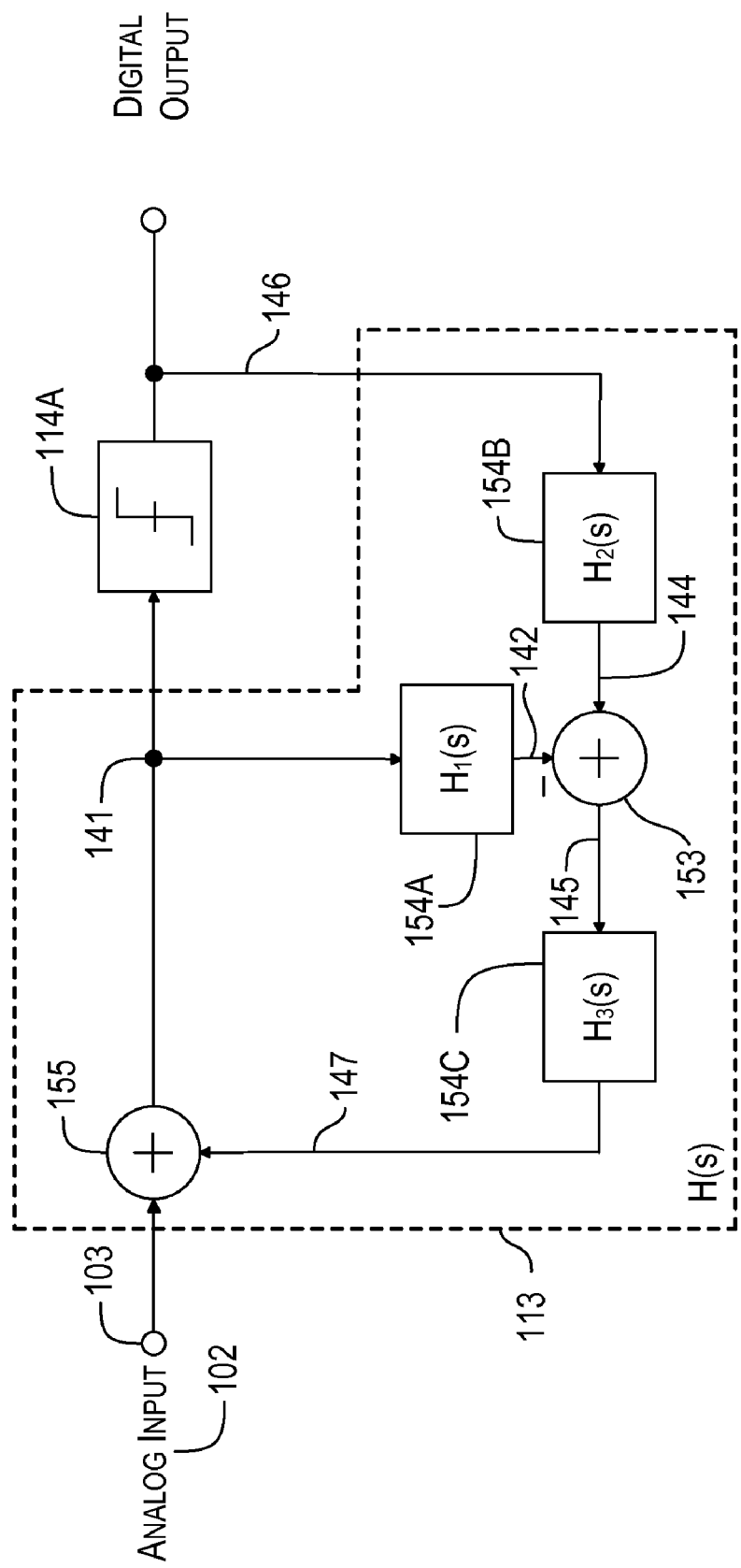
FIG. 7 is a block diagram of a Diplexed Feedback Loop (DFL) for producing quantization noise response minima at arbitrary frequencies with single-bit quantization.
Figure 8:
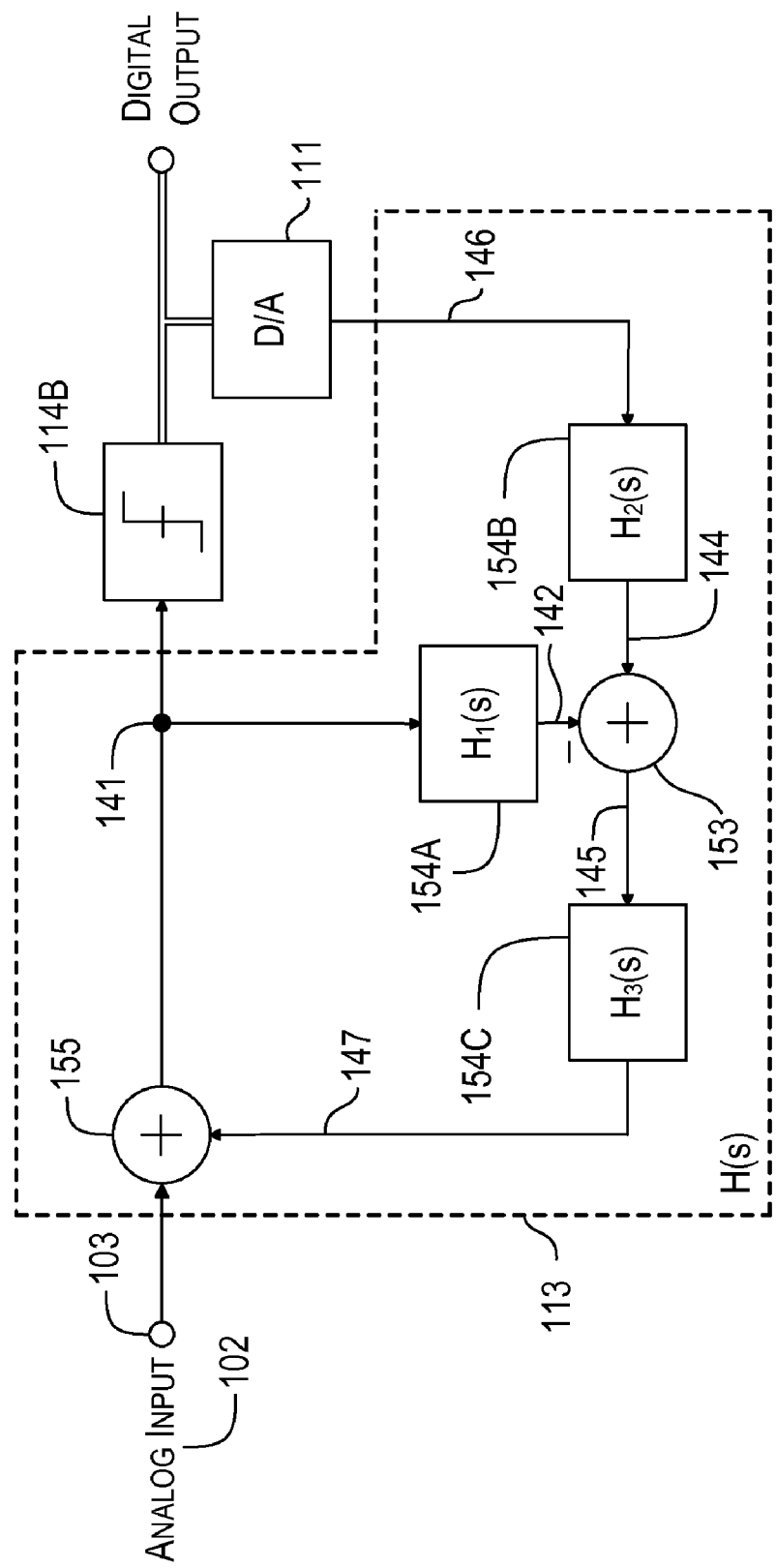
FIG. 8 is a block diagram of a Diplexed Feedback Loop (DFL) for producing quantization noise response minima at arbitrary frequencies with multi-bit quantization.

A simplified block diagram of an exemplary DFL 113 and a single-bit sampling/quantization circuit 114A is shown in FIG. 7, and a simplified block diagram of exemplary DFL 113, multi-bit sampling/quantization circuit 114B and digital-to-analog converter 111 is shown in FIG. 8. In the preferred embodiments of the invention, the quantization noise shaping is continuous-time and does not employ any filtering in the modulator feed-forward path (between adder 155 and sampler/quantizer 114A or 114B). The DFL 113 shares the latter feature with the conventional discrete-time, error-feedback filter described in D. Anastassiou "Error Diffusion Coding in A/D Conversion," IEEE Transactions on Circuits and Systems, Vol. 36, 1989.

In DFL 113, a signal 141 (that is output from adder 155 and input into sampler/quantizer 114A) is independently filtered 154A (which preferably includes moderate amplification, as discussed in greater detail below), using a filter transfer function M(s), thereby resulting in signal 142. At the same time, the output of sampler/quantizer 114A is independently filtered 154B, using a filter transfer function $H_2(s)$, thereby resulting in signal 144. Then, signal 142 is subtracted from signal 144 in subtractor 153, and the resulting combined signal 145 is filtered 154C, using a filter transfer function $H_3(s)$, thereby resulting in signal 147. Finally, signal 147 is combined with the input signal 102 in adder 155. Similar processing is illustrated in FIG. 8, although in that embodiment a digital-to-analog converter 111 is used to convert the multi-bit output of sampling/quantization circuit 114B into a continuous-time continuously variable signal that can be fed back into and processed by DFL 113. The process of independently filtering signals and then combining them sometimes is referred to in the prior art as diplexing. In the present embodiment, filters 154A-C include just basic amplifiers, attenuators and delay elements. Depending upon the filter parameters, filters 154A&B can be all-pass or can have appreciable magnitude variation across the relevant bandwidth that is being processed in the corresponding processing branch.

In the current embodiment, the quantization-noise-shaping filter response of DFL 113 can be configured to produce an absolute minimum at a selected (e.g., predetermined) frequency. Preferably, the quantization-noise-shaping filter 113 first inputs the original continuous-time continuously variable signal 102 and the signal output from the sampler/quantizer 114, determines a quantization error, and then filters or pre-processes that quantization error before adding it to the current value for the signal 102. Generally speaking, the addition of the quantization error ensures that future sample values will compensate for earlier quantization errors, while the preprocessing of the quantization error prior to such addition ensures that the quantization noise introduced by sampler/quantizer 114 will be shifted away from the frequency band of the input signal that is being processed by the current processing branch (e.g., branch 110 or 120).

As will be readily appreciated, filter 154C can be moved upstream of adder 153 (e.g., one instantiation in each branch) and/or any portion or all of its desired transfer function can be incorporated (or integrated) into each of filters 154A&B. In any event, the total filtering performed on signal 141 is $H_1(s) \cdot H_3(s)$, and the total filtering performed on signal 146 is $H_2(s) \cdot H_3(s)$. Each such combined filtering preferably includes delaying (e.g., at least ¼ or ½ of the sampling period used by sampler/quantizer 114), amplitude modification (e.g., by no more than 20 dB) and lowpass filtering (e.g., with a 3 dB bandwidth that is no greater than $f_S$), as discussed in greater detail below. The term "coupled", as used herein, or any other form of the word, is intended to mean either directly connected or connected through one or more other processing blocks, e.g., for the purpose of preprocessing. The term "adder", as used herein, is intended to refer to one or more circuits for combining two or more signals together, e.g., through arithmetic addition and/or (by simply including an inverter) through subtraction.

Like the CT DSM, the DFL circuit 113 has the advantage that impairments related to the single, coarse sampling operation 114 can be subjected to the noise-shaping response of the circuit. Because of the arrangement of the diplexer filters 154A-C in the feedback path of the noise-shaping circuit, quantization noise notches are produced by filter structures with transmission zeros, instead of transmission poles. Therefore, unlike the CT DSM, the DFL does not require high-gain transconductance stages (i.e., current sources) or operational amplifiers (i.e., voltage sources) with high-Q parallel resonators. Instead, only basic amplifiers (i.e., amplifiers with power output) with moderate gain preferably are used, e.g., to compensate for signal losses through the feedback loop of the DFL. Also, the diplexer filter responses (e.g., the response of filter 113) can be produced by passive, distributed-element circuits such as transmission lines and attenuators. Furthermore, as discussed in greater detail below, sensitivities to component tolerances can be mitigated by using programmable gain elements (i.e., amplifiers and/or attenuators).

Referring to the circuits in FIGS. 7 and 8, the signal transfer function (STF) and noise transfer function (NTF) at the input to the sampling/quantization circuit 114A or 114B preferably are:

STF(s)=1, and $$NTF(s) = \frac{1 + G \cdot H_1(s) \cdot H_3(s)}{1 + G \cdot H_3(s) \cdot (H_1(s) - H_2(s))},$$

such that for diplexer responses given by $$H_1(s) = \frac{\phi_1}{G} \cdot e^{-sT_3} + \frac{\phi_0}{G} \cdot e^{-sT_1},$$

$$H_2(s) = \frac{\phi_1}{G} \cdot e^{-sT_3} + \frac{\phi_0}{\beta_0 G} \cdot e^{-sT_2} \text{ and}$$

$$H_3(s) = \frac{1}{\beta_3 s^3 + \beta_2 s^2 + \beta_1 s + \beta_0},$$

the overall DFL noise transfer function is $$NTF(s) = \frac{\beta_3 s^3 + \beta_2 s^2 + \beta_1 s + \beta_0 \cdot (1 + \phi_1 \cdot e^{-sT_3} + \phi_0 \cdot e^{-sT_1})}{\beta_3 s^3 + \beta_2 s^2 + \beta_1 s + \beta_0 \cdot [1 + \phi_0 \cdot (e^{-sT_1} - e^{-sT_2})]}.$$

It can be shown that for the appropriate choice of diplexer filter parameters (i.e., $T_1$, $T_2$, $T_3$, $\phi_0$, $\phi_1$, $\beta_0$, $\beta_1$, $\beta_2$ and $\beta_3$), the DFL produces second-order noise-shaping responses that are comparable to conventional delta-sigma modulator (DSM) noise-shaping responses, but with performance that is stable and feedback-delay-variation tolerant.

The values of the parameters in the above NTF equation determine the frequency location of the notch, or null, in the quantization noise response ($f_{notch}$). In particular, the location of the frequency notch is coarsely determined by $\beta_i$ and the delay parameter, $T_1$, in increments greater than or equal to $\frac{1}{10} \cdot f_S$, and the location of the frequency notch is finely determined by the coefficient parameter, $\phi_1$, in increments less than or equal to $\frac{1}{8} \cdot f_S$. Table 1 provides exemplary, normalized (i.e., $f_S = 1$ Hz and $Z = 1$ ohm) filter parameters as a function of quantization-noise-response notch frequency. As indicated in Table 1, the mapping of filter parameters to the quantization-noise notch frequency ($f_{notch}$) is not a one-to-one function (e.g., non-isomorphic). However, the diplexer filter parameters and the quantization-noise notch frequency are related such that, for fixed $\phi_i$ and $\beta_i$, the quantization-noise notch frequency decreases when the primary filter coarse tuning parameter $T_1$ increases, and increases when the primary filter coarse tuning parameter $T_1$ decreases. This operation is different from that of a conventional, bandpass delta-sigma modulator, which has a frequency response of $NTF(s) = (1 - \alpha \cdot e^{-sT_S} + z^{-2sT_S})$, with the exponential argument $T_S$ being fixed and the quantization-noise-notch frequency ($f_{notch}$) being determined solely by the delta-sigma notch, modulator coefficient $\alpha$.

In one embodiment of the DFL, the $\beta_i$ parameters determine the cut-off frequency ($f_B$), or 3 dB bandwidth, of a third-order, lowpass filter response. Furthermore, in the preferred embodiments: (1) the lowpass filter response defined by the $\beta_i$ parameters is such that $f_B > 3 \cdot f_{notch}$; (2) the relationship between $T_1$ and $T_3$ is $T_3 = \frac{1}{2} \cdot T_1$; and (3) the relationship between $T_1$ and $T_2$ is $T_2 = T_1 - \frac{1}{2} \cdot T_S$, where $T_S$ is the period of the quantizer 114 sampling clock. Under these conditions, the signal transfer function (STF) of the noise-shaping filter is approximately all-pass, i.e., $STF(s) = k \cdot e^{-s\tau}$. Also, it is preferable that each delay variable $T_i$ includes the propagation, or settling, delays of the corresponding active component(s). Therefore, it is preferred that the propagation delay of the sampling circuits and/or amplifiers is less than $\frac{1}{4} \cdot T_S$ to enable the placement of quantization noise notches at frequencies up to $\frac{1}{2} \cdot f_S$ (i.e., the Nyquist bandwidth).

The DFL diplexer responses, according to the parameters given in Table 1, can be realized using high-frequency design techniques, such as those based on distributed microwave components and monolithic microwave integrated circuits (MMICs). Exemplary implementations that include a Diplexed Feedbak Loop 113 are: circuit 160 (shown in FIG. 9A) for negative values of $\phi_1$ and a single-bit sampler/quantizer 114A; and circuit 165 (shown in FIG. 9B) for positive values of $\phi_1$ and a multi-bit sampler/quantizer 114B. These implementations are based on a single-ended controlled-impedance (i.e., 50 ohm) system, and the delay ($e^{-sT}$) elements (e.g., delay elements 161A-C) are realized using transmission lines. Unlike continuous-time or discrete-time delta-sigma modulators, the DFL circuit requires only 50-ohm gain blocks (amplifiers) and distributed passive elements (attenuators, power splitters and transmission lines), except for the high-speed limiter (or, with respect to circuit 165, the multi-bit quantizer). In the exemplary circuit shown in FIG. 9A, the quantizer 114A is a hard limiter that produces a single-bit output. The hard limiter has the advantages of high-speed operation and precise quantization, but multi-bit quantizers instead could be used to improve converter resolution and performance stability, as illustrated by sampler/quantizer 114B in FIG. 9B. For circuit 160, $$H_1(s) = G \cdot (-g_1 \cdot e^{-sT_3} + g_0 \cdot e^{-sT_1});$$

$$H_2(s) = G \cdot (-g_1 \cdot e^{-sT_3} + g_0 \cdot e^{-sT_2}); \text{ and}$$

TABLE 1

Exemplary Normalized DFL Filter Parameters

| NTF Notch Freq. ($f_{notch}/f_{CLK}$) | $\frac{T_1}{T_{CLK}}$ | $\frac{T_2}{T_{CLK}}$ | $\frac{T_3}{T_{CLK}}$ | $\phi_0$ | $\phi_1$ | $\beta_0$ | $\beta_1$ | $\beta_2$ | $\beta_3$ |
|---|---|---|---|---|---|---|---|---|---|
| 0.00 | 8.00 | 7.50 | 4.00 | 2.00 | −3.00 | 6.1E−5 | 3.1E−3 | 7.9E−2 | 1.0 |
| 0.00 | 2.50 | 2.00 | 1.00 | 1.00 | −2.00 | 3.9E−3 | 4.9E−2 | 3.1E−1 | 1.0 |
| 0.01 | 8.00 | 7.50 | 4.00 | 1.80 | −2.70 | 6.1E−5 | 3.1E−3 | 7.9E−2 | 1.0 |
| 0.02 | 7.00 | 6.50 | 3.50 | 1.60 | −2.20 | 6.1E−5 | 3.1E−3 | 7.9E−2 | 1.0 |
| 0.05 | 7.00 | 6.50 | 3.50 | 1.10 | −0.20 | 6.1E−5 | 3.1E−3 | 7.9E−2 | 1.0 |
| 0.10 | 3.75 | 3.25 | 1.875 | 1.00 | 0 | 4.8E−4 | 1.2E−2 | 1.6E−1 | 1.0 |
| 0.15 | 2.70 | 2.20 | 1.35 | 1.00 | 0 | 3.9E−3 | 4.9E−2 | 3.1E−1 | 1.0 |
| 0.20 | 1.85 | 1.35 | 0.925 | 1.00 | 0 | 3.9E−3 | 4.9E−2 | 3.1E−1 | 1.0 |
| 0.25 | 1.35 | 0.85 | 0.675 | 1.00 | 0 | 3.9E−3 | 4.9E−2 | 3.1E−1 | 1.0 |
| 0.25 | 1.60 | 1.10 | 0.80 | 1.00 | 0 | 1.3E−2 | 1.1E−1 | 4.7E−1 | 1.0 |
| 0.30 | 1.00 | 0.50 | 0.50 | 1.00 | 0 | 3.9E−3 | 4.9E−2 | 3.1E−1 | 1.0 |
| 0.30 | 1.25 | 0.75 | 0.625 | 1.00 | 0 | 1.3E−2 | 1.1E−1 | 4.7E−1 | 1.0 |
| 0.35 | 1.00 | 0.50 | 0.50 | 1.00 | 0 | 1.3E−2 | 1.1E−1 | 4.7E−1 | 1.0 |
| 0.40 | 1.00 | 0.50 | 0.50 | 0.90 | 0.20 | 3.1E−2 | 2.0E−1 | 6.3E−1 | 1.0 |
| 0.45 | 0.75 | 0.25 | 0.25 | 1.00 | 0 | 3.1E−2 | 2.0E−1 | 6.3E−1 | 1.0 |
| 0.50 | 0.75 | 0.25 | 0.25 | 0.95 | 0.22 | 3.1E−2 | 2.0E−1 | 6.3E−1 | 1.0 |

-continued $$H_3(s) = \frac{\beta_0}{\beta_3 s^3 + \beta_2 s^2 + \beta_1 s + \beta_0}.$$

For circuit 165, $$H_1(s) = G \cdot (g_1 \cdot e^{-sT_3} + g_0 \cdot e^{-sT_1});$$

$$H_2(s) = G \cdot (g_1 \cdot e^{-sT_3} + g_0 \cdot e^{-sT_2}); \text{ and}$$

$$H_3(s) = \frac{\beta_0}{\beta_3 s^3 + \beta_2 s^2 + \beta_1 s + \beta_0}$$

Figure 9A:
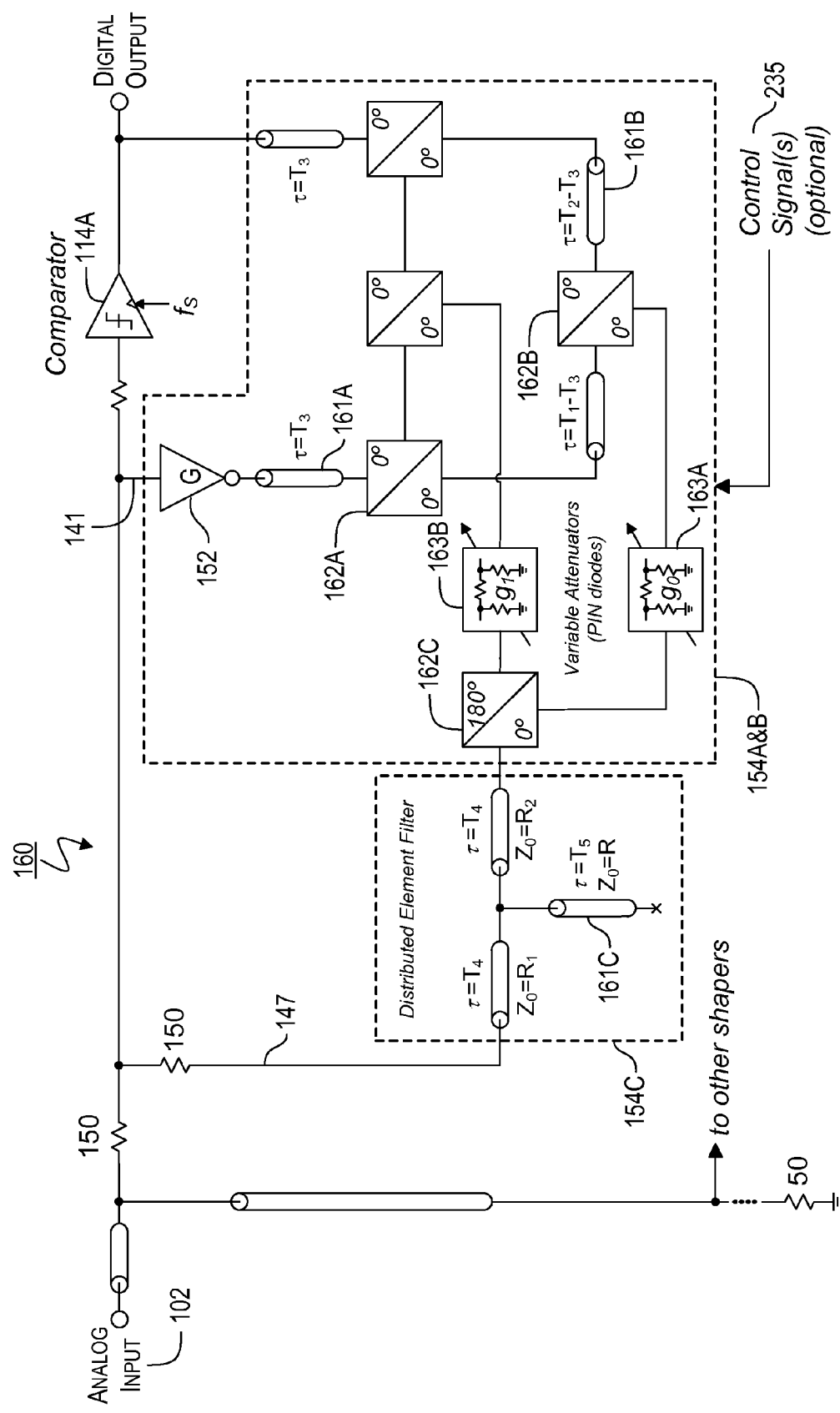
FIG. 9A is a circuit diagram of an exemplary implementation of a Diplexed Feedback Loop (DFL) noise-shaping filter for negative trimming/calibration of $f_{notch}$ values using resistive networks for signal summing and signal distribution.
Figure 9B:
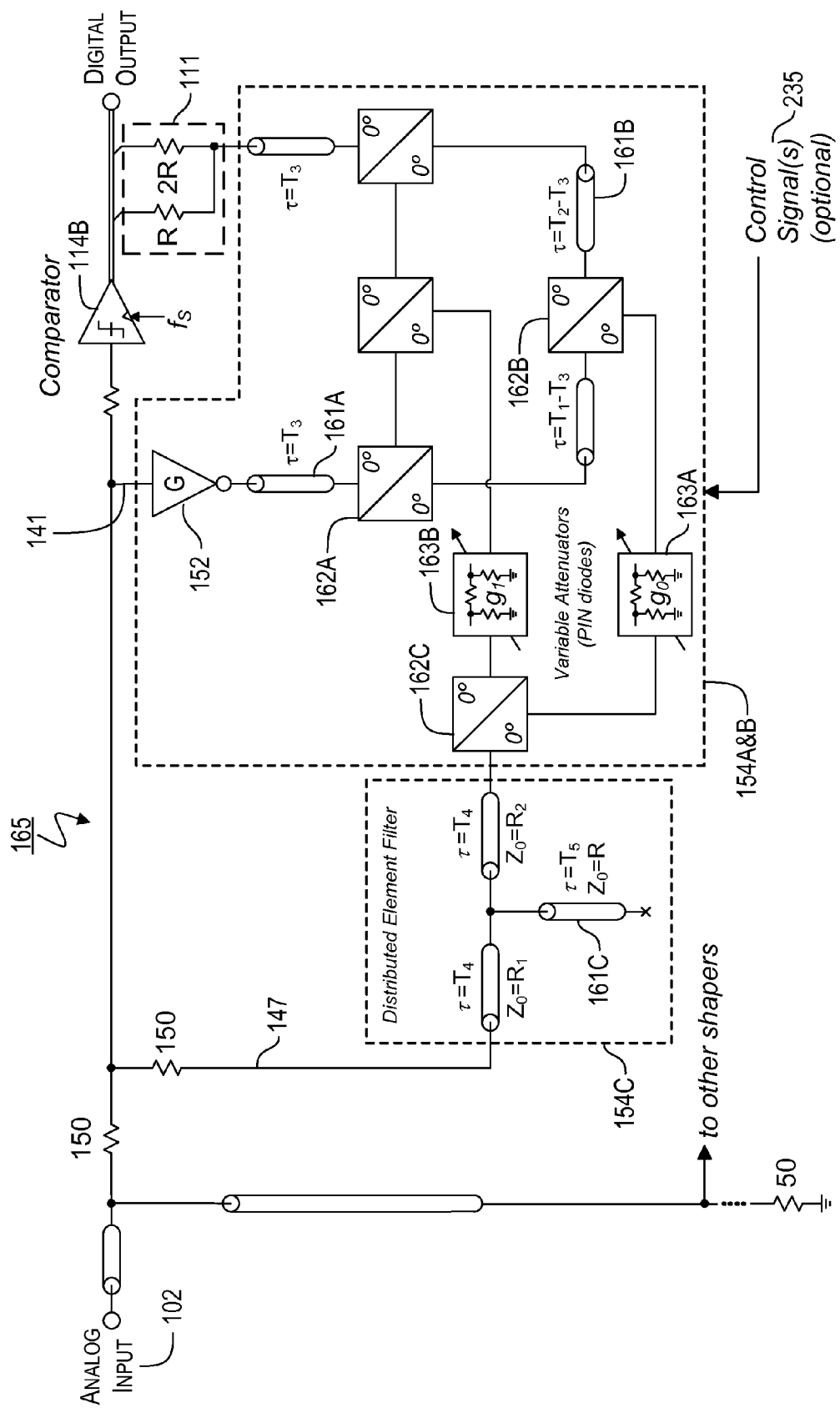
FIG. 9B is a circuit diagram of an exemplary implementation of a Diplexed Feedback Loop (DFL) noise-shaping filter for positive trimming/calibration of $f_{notch}$ values using resistive networks for signal summing and signal distribution.
Figure 9C:
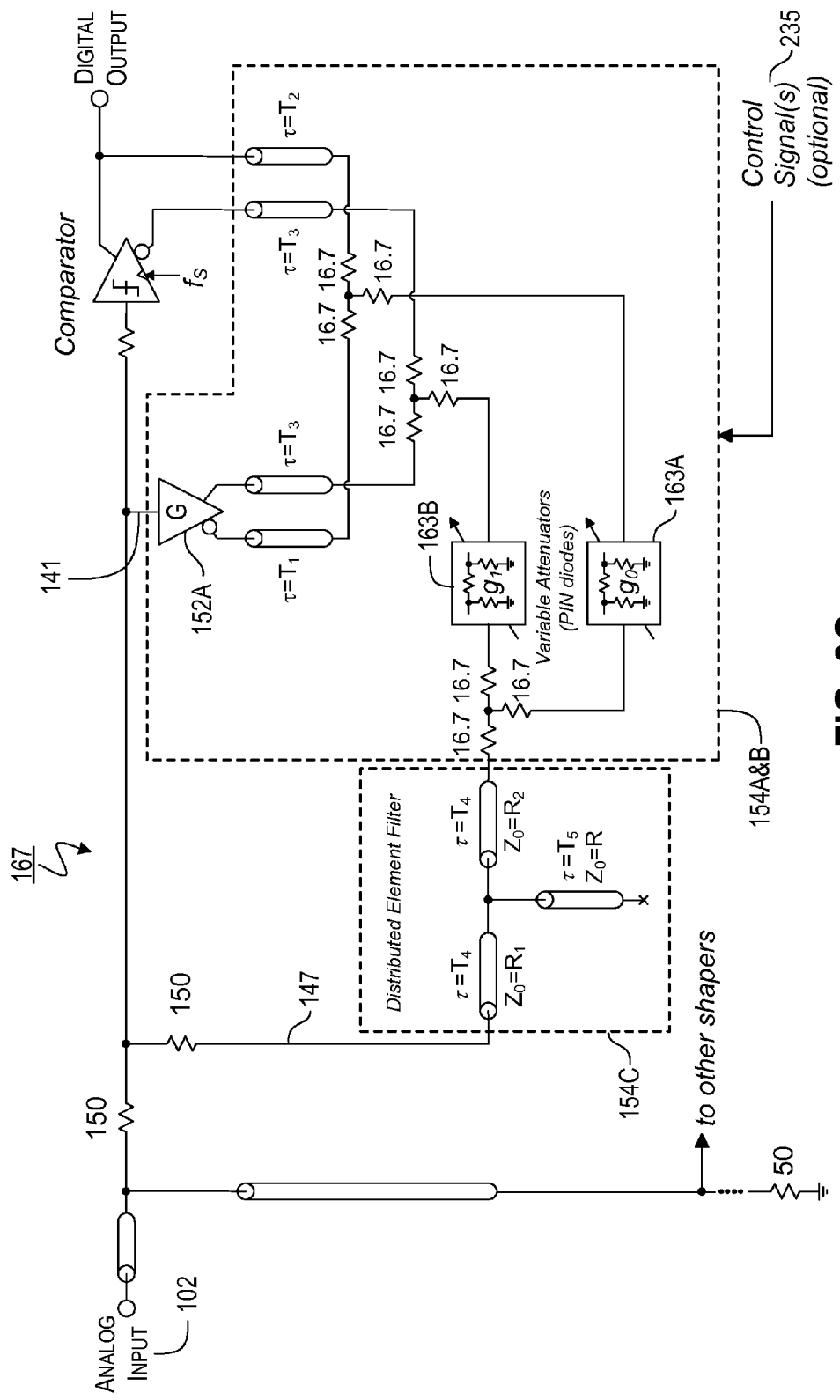
FIG. 9C is a circuit diagram of an exemplary implementation of a Diplexed Feedback Loop (DFL) noise-shaping filter for negative trimming/calibration of $f_{notch}$ values using reactive splitters.
Figure 9D:
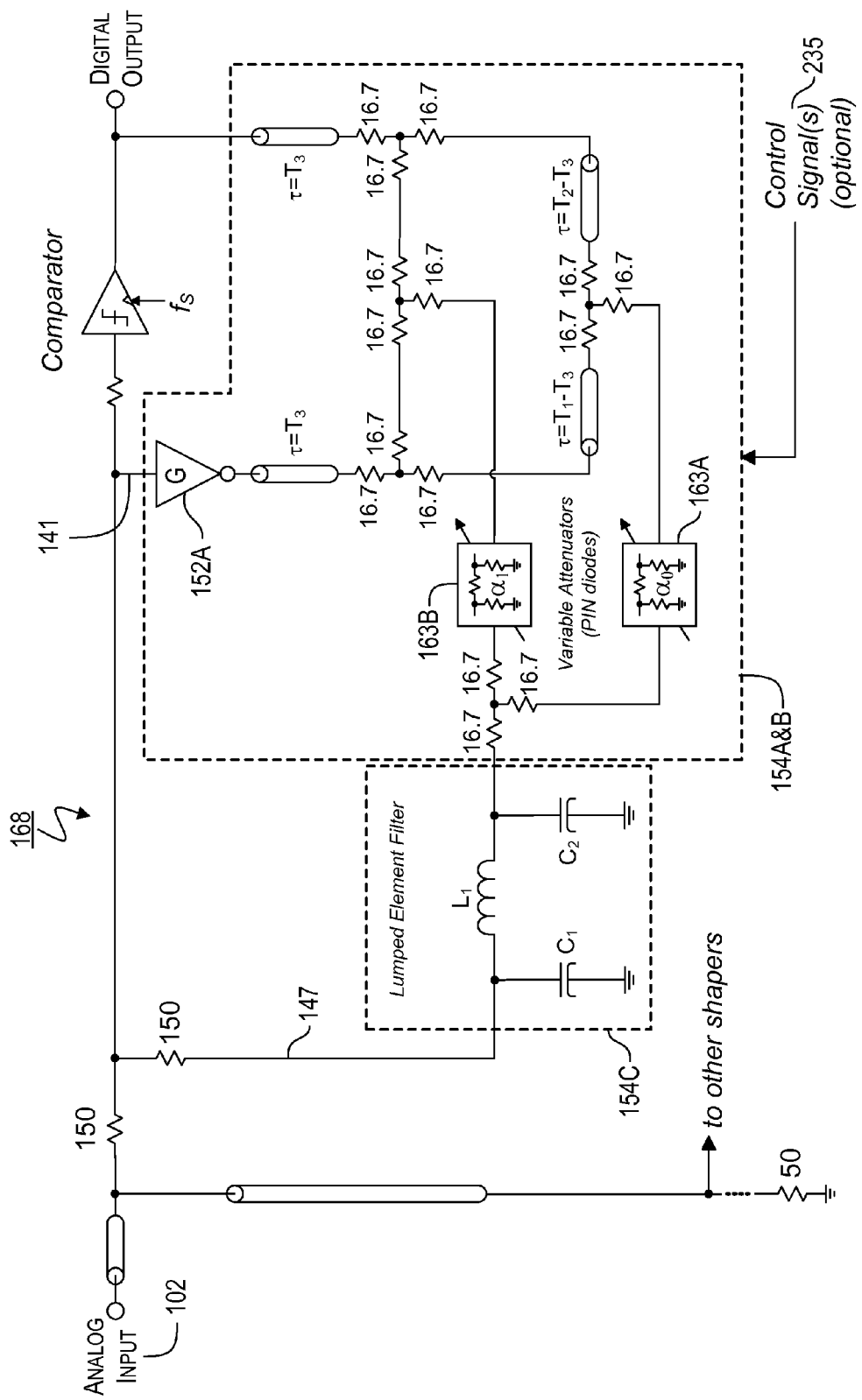
FIG. 9D is a circuit diagram of an exemplary implementation of a Diplexed Feedback Loop (DFL) noise-shaping filter for positive trimming/calibration of $f_{notch}$ values using resistive networks for signal summing and signal distribution.
Figure 10:
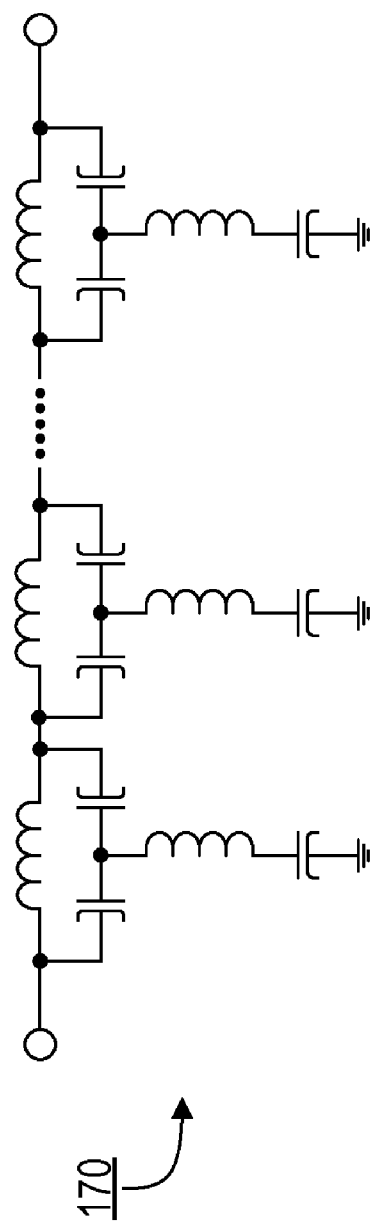
FIG. 10 illustrates a circuit diagram of a conventional delay element for use in a representative embodiment of the present invention.

Thus, in the exemplary circuits shown in FIGS. 9A&B, the parameters are determined by the values of variable attenuators 163A&B (with $\phi_i = g_i G^2$). Alternate variable attenuators can be implemented using semiconductor devices, such as PIN diodes and field-effect transistors (FETs), or can be implemented using a switched array of fixed resistor networks. Still further, the value of $\phi_i$ instead could be set based on the gain of a programmable gain amplifier. In FIGS. 9A&B, the amplifier 152 provides a gain G of dB (although other gains up to, e.g., approximately 40 dB instead could be provided to compensate for different signal losses through the feedback path of the DFL). Also, in these embodiments signal summing and signal distribution is accomplished via power splitters and combiners (e.g., 162A-D) that, for example, can be implemented using a combination of coupled transmission lines, active devices, and/or reactive (magnetic) networks. However, other means of signal summing and distribution exist, including resistive networks known as Wye splitters/combiners, as shown for circuits 167 (which has the same DFL filter transfer functions as circuit 160 discussed above) and 168 (which has the same DFL filter transfer functions as circuit 165 discussed above) in FIGS. 9C&D, respectively. Resistive splitters have the advantages of very broadband operation and small size, but reactive splitters can be used to reduce signal losses and reduce amplifier gain. For example, amplifier 152A in circuit's 167 and 168 preferably has a gain of 30 dB. In addition, a DFL circuit according to the present invention is easily adapted for differential systems, and the basic design can be altered for construction using uncontrolled impedance devices (i.e., transconductance stages) or lumped element components, without loss of generality. For example, instead of transmission lines, any or all of the delay elements can be implemented using active or reactive structures, such as buffers or as passive lattice structures, such as circuit 170 shown in FIG. 10.

Figure 11:
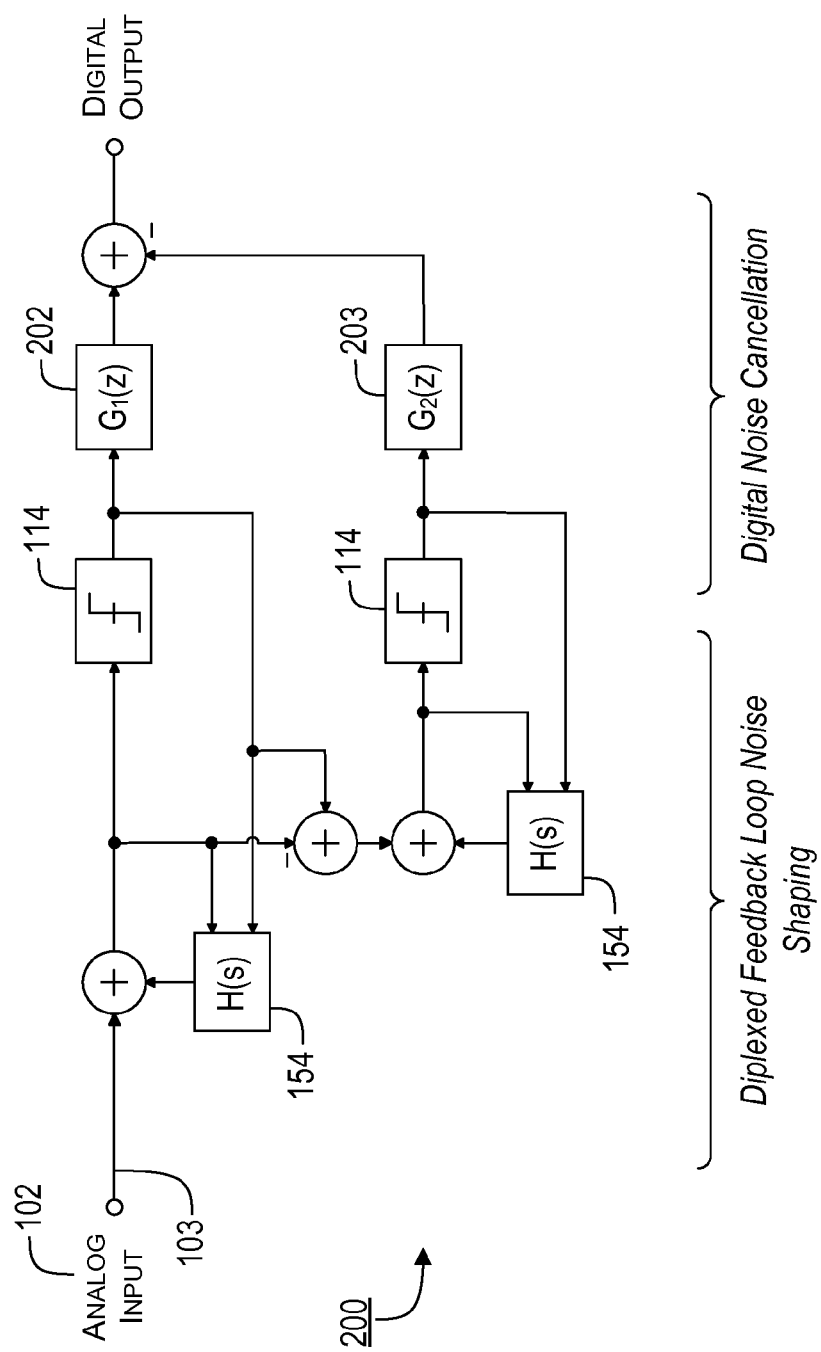
FIG. 11 is a block diagram of a fourth-order Diplexed Feedback Loop (DFL) noise-shaping filter.

Each of the DFLs shown in FIGS. 9A-D has a second-order noise-shaping response. However, like the MASH (i.e., Multi-stAge SHaping) structures used with conventional DSMs, it is possible to realize improved noise-shaping performance by including additional DFL stages in a parallel arrangement to create higher-order responses. A fourth-order noise-shaping DFL 200 is shown in FIG. 11. Higher-order cascade structures also are possible, but the parallel arrangement generally exhibits better stability than the cascade structure, particularly for high-order (i.e., >3) noise shaping and single-bit sampling. However, the parallel structure generally requires the digital interface to handle two single-bit inputs rather than one single-bit input. The transfer functions of the additional filters 202 and 203 shown in FIG. 11 preferably are: $G_1(z)=1$ and $G_2(z)=1+H(z)=1+\rho_1 \cdot z^{-1}+\rho_0 \cdot z^{-2}$, respectively, where the p are chosen such that the response of $G_2(z)$ closely matches the NTF of the first DFL stage. The coefficient $\rho_1$ is calculated based on the NTF notch frequency ($f_{notch}$) of the first stage according to $\rho_1 = 2 \cdot \cos(2 \cdot \pi \cdot f/f_S)$, and the coefficient $\rho_0$ is determined based on the Q of the quantization noise response first stage, such that $\rho_0 \approx 1$. Higher-order noise-shaping responses generally enable more quantization noise to be removed by the Moving Average Reconstruction (or other reconstruction) bandpass filter(s) that follow the noise-shaping filter.

As indicated in Table 1, the mapping of filter parameters to the quantization-noise notch frequency is not a one-to-one function (e.g., non-isomorphic). However, the filter parameters and the quantization-noise notch frequency are related such that: (1) for fixed $\phi_i$ and $\beta_i$, the quantization noise notch frequency decreases with increasing primary coarse-tuning parameter $T_1$; and (2) for fixed $\beta_i$ and $T_i$, the quantization noise notch frequency increases with increasing fine-tuning parameter $\phi_1$. The latter relationship suggests a method for calibrating the DFL response to account for component variations. For the second-order DFL shown in FIGS. 9A-D, the parameters $T_i$ and $\beta_i$ noise response, while the fine location of the notch frequency and its quality (Q) factor (i.e., notch depth) are determined by the tuning parameters $\phi_i = g_i G^2$. Given that, ultimately, the shaped quantization noise is passed through a narrowband Moving Average Reconstruction (MAR) or other bandpass filter, the noise at the MAR filter output typically will not be at the minimum level if the location of the quantization noise null is not precisely aligned with the center frequency of the MAR bandpass response. Use of a variable attenuator or variable-gain amplifier allows the DFL tuning parameters, $\phi_i$, to be dynamically adjusted, or adjusted based on manufacturing trim operations.

Figure 12A:
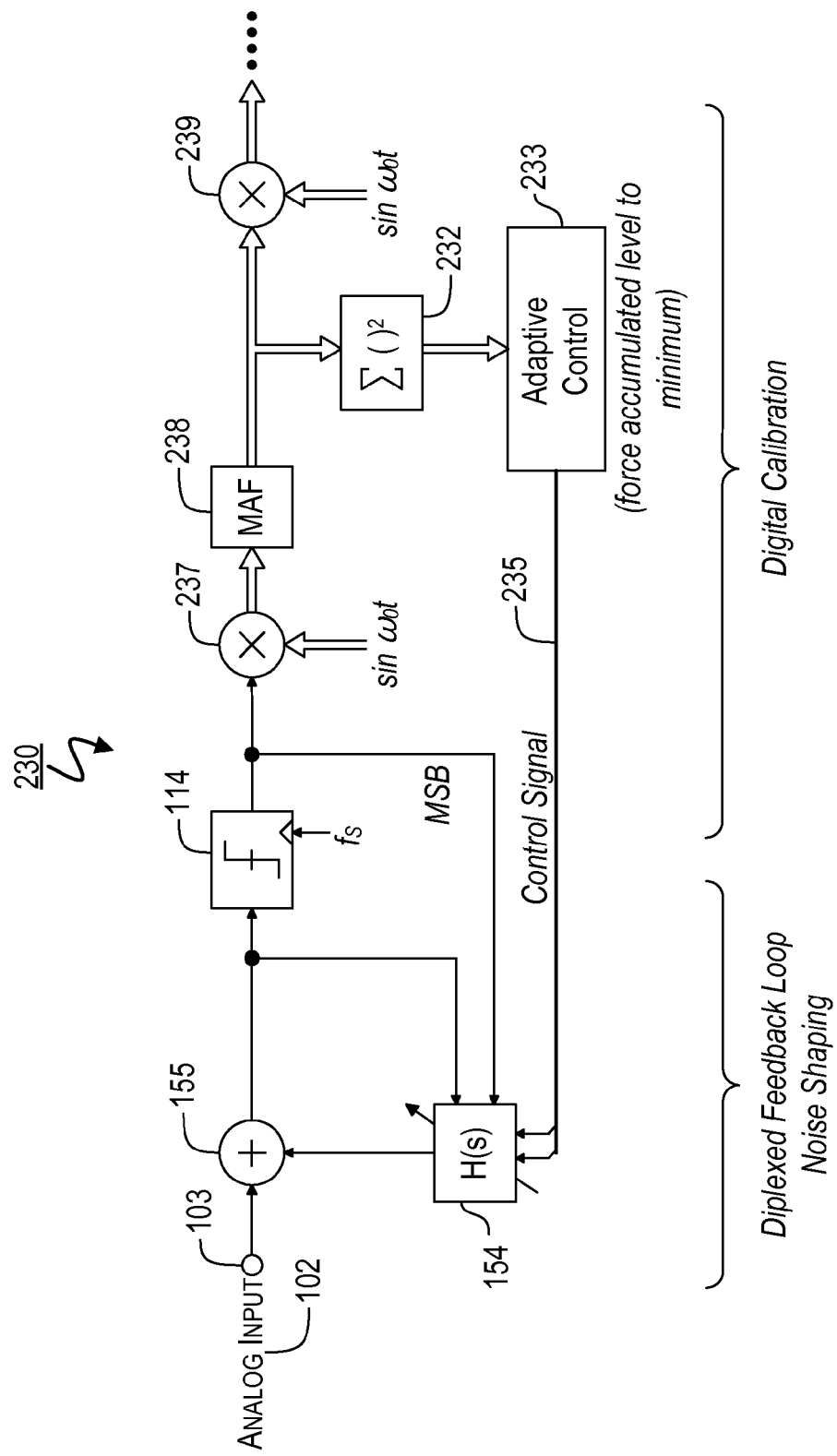
FIGS. 12A and 12B illustrate second- and fourth-order Diplexed Feedback Loop (DFL) noise-shaping filter circuits, respectively, that use active calibration.
Figure 12B:
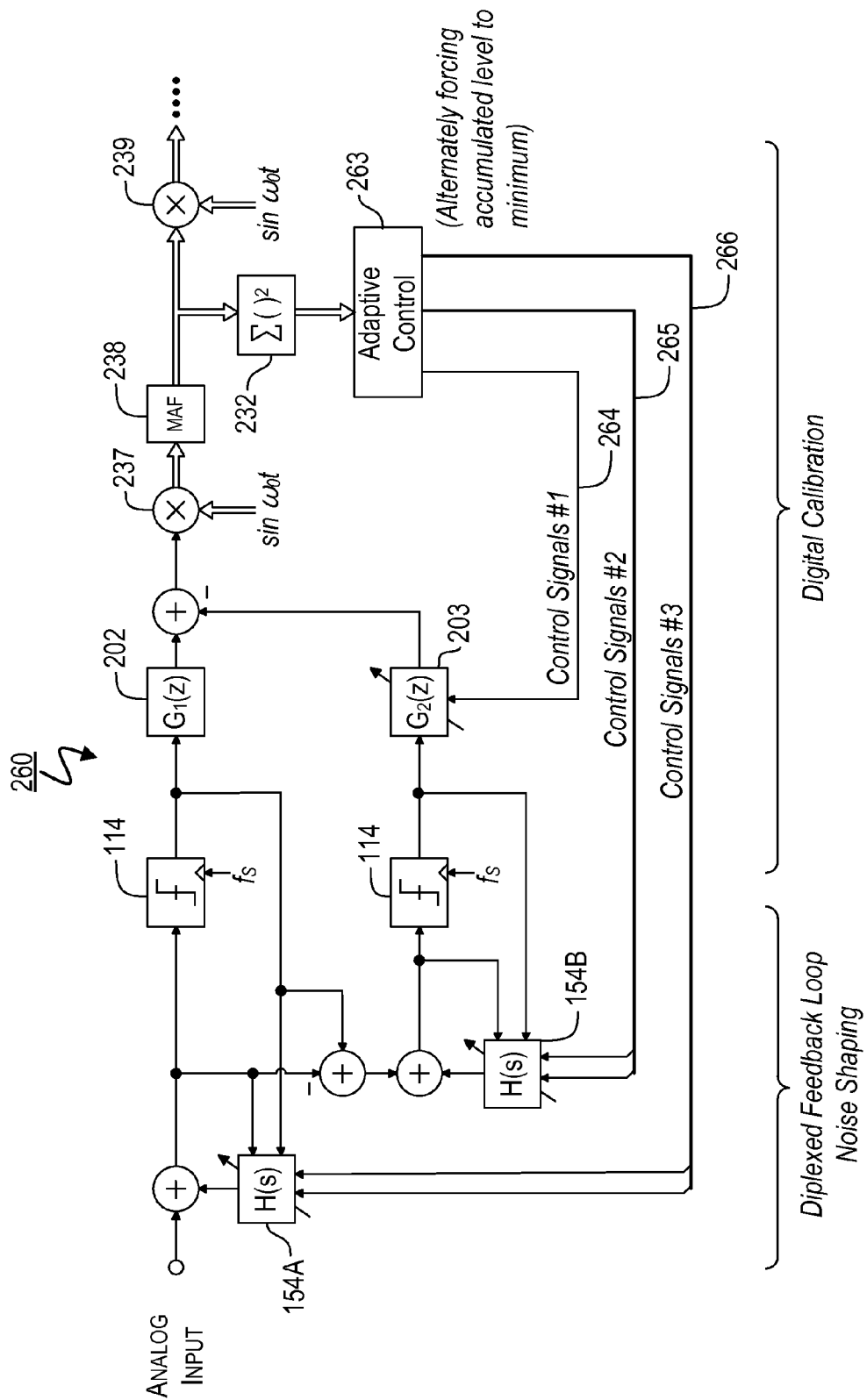

An exemplary coefficient calibration (i.e., tuning) circuit 230 is shown in FIG. 12A for single-stage noise shaping, and an exemplary circuit 260 is shown in FIG. 12B for multi-stage noise shaping. Because the quantization noise of the DFL is additive with respect to the input signal, the level at the output of the moving average (MAF) filter 238 is proportional to the level of added quantization noise. When the DFL response is properly tuned, such that the fine-tuning parameters $\phi_i$ produce a quantization noise null at the correct frequency (i.e., the downconversion frequency or the center frequency of the MAR bandpass response), the added quantization noise is at a minimum. By sensing the power at the moving average filter (MAF) output, using a square-law operation 232 (as shown in FIGS. 12A&B) or an absolute-value operation, it is possible to adjust the DFL fine-tuning parameters $\phi_i$ using, e.g., an algorithm that employs joint optimization, gradient descent and/or genetic principles within processing block 233 in circuit 230, or processing block 263 in circuit 260, until the level at the MAF output is forced to a minimum. With respect to circuit 230, based on the output level at the MAF output (e.g., as determined in block 232), the algorithm generates a control signal(s) 235 that correct for errors in the DFL response using fine-tuning parameters $\phi_i$ (e.g., by varying the $g_i$). With respect to circuit 260, based on the output level at the MAF output (e.g., as determined in block 232), the algorithm generates control signals 265 and 266 that correct for errors in the response of each DFL (154A and 154B), and generates control signal 264 that adjusts the response of filter 203 to compensate for feedback loop gain errors in the first stage of the noise-shaping circuit (i.e., the stage that includes blocks 114 and 154A). Because the noise-shaping circuit topology depends on the sign of fine-tuning parameter $\phi_1$, e.g., as illustrated in FIGS. 9A&B, the preferred calibration approach is one where the coarse location of $f_{notch}$ is set intentionally low or high, using filter parameters $T_i$ and $\beta_i$, such that the noise-shaping response can be fine tuned with strictly positive or negative values of $\phi_1$.

The required accuracy of $f_{notch}$ depends on the intended resolution of the data converter, which is commonly specified in terms of effective number of bits, B. For example, an oversampled converter with M branches having quantization noise responses $NTT_i$, has a resolution of $$B = -\frac{1}{2} \log_2 \sum_{i=1}^{M} \left( \int_0^{f_S/2} |NTF_i(e^{2\pi jfT}, P) \cdot F_i(e^{2\pi jfT})|^2 df \right),$$

where $F_i(e^{2\pi jfT})$ are the frequency responses of the Moving Average Reconstruction (MAR) filters. Differentiation of the above equation with respect to the diplexer filter parameters (i.e., $T_1$, $T_2$, $T_3$, $\phi_0$, $\phi_1$, $\beta_0$, $\beta_1$, $\beta_2$ and $\beta_3$) provides the mathematical relationship between converter resolution and filter parameter accuracy.

The resolution of the converter improves rapidly as diplexer parameter accuracy improves to better than ±1%. Data converter applications targeting precision of 9 bits or more preferably have diplexer parameter tolerances of better than ±0.25% (~½$^9$·100%). On the other hand, data converter applications requiring less precision can accommodate larger tolerances. For example, errors of ±3% usually are sufficient for data converter applications requiring precision of 5 bits or less. Although electronic components can be manufactured to accuracies of ±1% or better, use of a variable attenuator or variable-gain amplifier allows the DFL fine-tuning parameters, $\phi_i$, to be dynamically adjusted, or adjusted based on manufacturing trim operations.

In general, M noise-shaping DFLs produce M quantization noise response nulls at frequencies spaced across the Nyquist (½·$f_S$ or ½ of the normalized frequency) bandwidth of the converter. A converter 100 using M noise-shaping DFLs sometimes is described herein as having a frequency-interleaving factor of M, or a channel-based oversampling ratio of M. Unlike conventional oversampling converters, where the conversion accuracy is primarily a function of an excess-rate oversampling ratio (N), defined as the ratio between the converter sample/clock rate and the converter output signal bandwidth (½·$f_S$/BW), the conversion accuracy of the MBO converter depends on a traditional excess-rate oversampling ratio (N), which preferably is kept low (preferably, less than 4 and, more preferably, 1) and the interleave factor (M), which preferably is substantially higher than N (e.g., at least 2·N or at least 4·N). Therefore, for the MBO converter, it is more appropriate to refer to an "effective" oversampling ratio, which is defined as M×N, where N is the traditional excess-rate oversampling ratio equal to ½·$f_S$/BW. It is noted that this effective oversampling ratio is different than the effective resolution of the converter 100, which also depends on the quality of the filters employed. Because the effective oversampling ratio of the MBO converter 100 directly depends on the number of converter processing branches (i.e., the frequency interleave factor), the oversampling ratio can be increased, without increasing the converter sample rate clock, by using additional noise-shaping DFLs (or processing branches).

As discussed above, the notch frequency ($f_{notch}$) the DFL response is coarsely determined by a delay parameter, $T_1$, in conjunction with associated parameters $\beta_i$. Increasing the coarse tuning parameter $T_1$, relative to the sampling rate period (1/$f_S$), generally has the consequence of reducing the effective order of the DFL's quantization noise-shaping response. Similarly, decreasing the coarse tuning parameter $T_1$, relative to the sampling rate period (1/$f_S$), generally has the consequence of increasing the effective order of the DFL's quantization noise-shaping response. For this reason, in representative embodiments of the invention, it is sometimes preferable for the M quantization noise response nulls to be at frequencies ($f_{notch}$) that are not uniformly spaced across the (signal) bandwidth of the converter. In contrast, quantization noise nulls are spaced evenly across the converter bandwidth in conventional ΠΔΣ and MBΔΣ converters.

Bandpass (Signal Reconstruction) Filter Considerations

The primary considerations for the bandpass filters used in signal reconstruction according to the preferred embodiments of the present invention are: (1) design complexity (preferably expressed in terms of required multiplications and additions), (2) frequency response, (3) amplitude and phase distortion, and (4) latency. The best converter-resolution performance is obtained for quantization noise-reduction filters having frequency responses that exhibit steep roll-off and high stopband attenuation. In addition, it is desirable for the filter responses to have suitable signal-reconstruction properties to prevent performance degradation due to amplitude and phase distortion. For example, it can be shown that the $sinc^{P+1}$ (comb) filters responses that conventionally have been considered near-optimal in oversampling converters and are used in ΠΔΣ conversion (e.g., as in Galton), do not in fact exhibit the near-perfect reconstruction filter-bank properties that are preferred in parallel oversampling converters with multiple processing branches. Also, although stopband attenuation generally increases with filter order, increases in filter order result in greater processing latency for certain filter structures, such as non-recursive, finite-impulse-response (FIR) filters. Bandpass filters with low latency are preferred to support applications where latency can be a concern, such as those involving control systems and servo mechanisms.

The conventional signal-reconstruction methods used in ΠΔΣ converters (such as in Galton) and in MBΔΣ converters (such as in Aziz and Beydoun) are not suitable for the present MBO converters because they introduce unacceptable levels of amplitude and phase distortion (e.g., conventional comb filters) or they entail a degree of signal-processing complexity that can be a problem for converters with a large number of processing branches (e.g., conventional filter banks and window filters). For these reasons, signal reconstruction in the MBO converter preferably is based on an innovation described herein as Moving Average Reconstruction (MAR), which can result in insignificant amplitude and phase distortion and which can require significantly lower complexity than conventional approaches.

The desired bandpass filter frequency response preferably depends on the intended resolution of the converter (B), on the order of the noise-shaping filter response (P), and on the effective oversampling ratio of the converter (M×N). For an oversampling converter with M channels, $$B = -\frac{1}{2} \cdot \log_2 \left[ \sum_{i=1}^{M} \left( \int_0^{f_S/2} |NTF_i(e^{2\pi jfT}, P) \cdot F_i(e^{2\pi jfT})|^2 df \right) \right]$$

where $NTF_i(e^{2\pi jfT},P)$ is a noise-shaping filter response with order P, where $F_i(e^{2\pi jfT})$ are the frequency responses of the digital bandpass (signal reconstruction) filters, and where the square-bracketed term in the above equation represents an overall level of quantization noise attenuation. In addition, for near-perfect signal reconstruction, the digital bandpass filter bank preferably introduces insignificant or no amplitude and phase distortion. Near-perfect signal reconstruction preferably requires that:

$$\sum_{i=1}^{M} F_i(z) = k \cdot z^{-n}, \text{ for } k = \text{constant} \quad \text{(i.e., strictly complementary)}$$

$$\sum_{i=1}^{M} |F_i(e^{2\pi jfT})|^2 = \text{constant} \quad \text{(i.e., power complementary)}$$

$$\sum_{i=1}^{M} F_i(z) = A(z), \text{ for } A(z) \to \text{all-pass} \quad \text{(i.e., } \textit{allpass} \text{ complementary)}$$

To the extent that the digital bandpass filter bank introduces appreciable amplitude and phase distortion, the minimum signal-to-distortion power ratio (SDR) of the quantization noise filter bank preferably depends on the intended effective resolution (B) of the converter, and is approximately given by SDR≧6·B, or 6 dB per bit.

The sinc$^{P+1}$ filter responses, which conventionally have been considered near-optimal for oversampling converters, do not necessarily provide adequate signal-reconstruction properties for oversampling converters with parallel or multiple processing branches. A general recursive form of the sinc$^{P+1}$ (comb) filter transfer function is $$S(z) = \left(\frac{1 - z^{-J_1}}{1 - z^{-1}}\right)^{P_1} \left(\frac{1 - z^{-J_2}}{1 - z^{-1}}\right)^{P_2},$$

but the filter conventionally is implemented with the transfer function $$S(z) = \left(\frac{1 - z^{-kJ}}{1 - z^{-1}}\right)^{P},$$

where $$J = \frac{p_1 \cdot (J_1 - 1) + p_2 \cdot (J_2 - 1)}{p_1 + p_2} + 1 \text{ and } p = p_1 + p_2.$$

For conventional oversampling converters, J is made equal to the converter oversampling ratio (i.e, J=M×N), p is made equal to one more than the order of the noise-shaping filter (i.e., p=P+1), and the constant k is made equal to 2 so that the comb-filter frequency response has spectral notches at multiples of the converter output rate. This configuration conventionally has been considered a near-optimal condition for oversampling converters. However, for 65 parallel processing paths (M=65) and second-order noise shaping (P=2), the sinc$^{P+1}$ filter bank realizes 42 decibels (dB) of quantization noise attenuation (i.e., 7-bit resolution), when k=2, but the signal-to-distortion power ratio of the filter bank is 0 dB (i.e., zero-bit resolution). For 65 parallel processing paths (M=65) and fourth-order noise shaping (P=4), the quantization noise attenuation of the sinc$^{P+1}$ filter bank improves to 77 dB (i.e., 13-bit resolution), when k=2, but the signal-to-distortion power ratio of the filter bank is still 0 dB (i.e., zero-bit resolution). Therefore, output equalizers are employed in conventional parallel oversampling converters to reduce amplitude and phase distortion and, thereby, to increase the signal-to-distortion power ratio. However, such output equalizers increase circuit complexity without completely eliminating the amplitude and phase distortion of the sinc$^{P+1}$ filter bank.

Generally, for applications requiring up to 10 bits of conversion accuracy, the conventional filter banks used in MBΔΣ (such as in Aziz) converters and the FIR window filters (Hann filters) described by Beydoun, have suitable quantization noise attenuation and signal-reconstruction properties for impulse-response lengths of 4·N·(M−1) and one-sided bandwidths of $f_S/[N \cdot (M-1)]$. Conventional filter banks are based on prototype finite impulse responses (FIR), designed using conventional methods such as Parks-McClellan and window-based methods, which are sometimes refined using iterative routines, spectral factorization, or constrained optimization techniques. For example, a linear-phase FIR prototype design based on a Kaiser window with β=3, or its equivalent, ensures greater than 64 decibels (dB) of quantization noise attenuation (i.e., 11-bit resolution) for fourth-order noise shaping and 65 processing branches (M), as well as signal-to-distortion power ratios of 62 dB (i.e., 10-bit resolution).

Conventionally, it is well-understood that these FIR prototype lowpass responses, and the window filter responses (Beydoun), can be converted to bandpass responses through multiplication of the prototype filter coefficients by a cosine wave having a frequency equal to the desired center frequency of the bandpass filter (i.e., cosine-modulated filter banks) However, the present inventor has discovered that the performance of conventional filter banks is realized at the expense of very high complexity, as these filters require 2·(M−1) multiplications and 4·(M−1) additions. Generally, a small reduction in filter complexity is realized when, as shown in FIG. 13A, such bandpass filters are implemented using downconversion 320 to shift the applicable band (having a center frequency of $\omega_0$) to a center frequency of zero, low-pass filtering 322, and then upconversion 324 to shift the applicable band back to its original frequency range (as described in Beydoun).

Although apparently not understood by Beydoun, recursive window filters exist that exhibit equivalent properties to FIR window filters, but typically can be implemented more efficiently. For example, consider a lowpass filter with impulse response $$h(n) = a_0 - a_1 \cos\left(\frac{2\pi n}{L-1}\right) + a_2 \cos\left(\frac{4\pi n}{L-1}\right) - a_3 \cos\left(\frac{6\pi n}{L-1}\right),$$

for $a_0$=0.35875, $a_1$=0.48829, $a_2$=0.14128, $a_3$=0.01168, and L=4·(N−1). This filter, which is defined in the prior art as a Blackman-Harris window filter, provides greater than 59 decibels (dB) of quantization noise attenuation (i.e., 10-bit resolution) for fourth-order noise shaping and 65 processing branches (M), in addition to signal-to-distortion power ratios of greater than 84 dB (i.e., 14-bit resolution). As significantly, this filter has a transfer function equal to $$H(z) = a_0 \cdot \frac{1 - z^{-L}}{1 - z^{-1}} - \sum_{i=1}^{3} a_i \cdot \frac{1 - \cos\left(\frac{2\pi i}{L-1}\right)(z^{-1} + z^{-L}) + z^{-(L+1)}}{1 - 2 \cdot \cos\left(\frac{2\pi i}{L-1}\right) \cdot z^{-1} + z^{-2}}$$

which requires only 10 multiply operations for lowpass filtering, regardless of the impulse response length L. Additional multiplication operations are required for transforming the lowpass response to a bandpass response, but the recursive cosine window filters still represent a considerable complexity savings over the direct FIR approach. However, the present inventor has discovered that when recursive filters of this form are implemented using high-frequency, parallel-processing methods, such as polyphase decomposition, the complexity costs associated with the coefficient dynamic range can exceed any complexity savings afforded by the recursive structure.

Comb or sinc filters can be considered a subset of a more general class of lowpass filters that can be called cascaded moving-average filters. The present inventor has discovered that comb filter banks do not generally have near-perfect signal-reconstruction properties and, in particular, that comb filter banks with order P+1 (i.e., $\text{sinc}^{P+1}$) and frequency response notches at multiples of the output data rate exhibit very poor performance with regard to amplitude and phase distortion. In addition, the present inventor has discovered that certain types of cascaded moving-average filters do exhibit near-perfect signal-reconstruction properties, including some comb filters, when the order of the filter is other than P+1 and/or when the frequency response notches are not at multiples of the output data rate. The use of cascaded moving-average filter responses to realize near-perfect reconstruction filter banks is an invention referred to herein as Moving Average Reconstruction (MAR). The comb filters utilized in Moving Average Reconstruction preferably have transfer functions S(z), as defined above, with integer parameters J, k and p that are selected from the space (or any portion thereof) defined by the following conditions:

$$2 \le J \le 2 \cdot M \cdot N \text{ and}$$
$$\frac{4 \cdot M \cdot N \cdot k}{J} - \frac{2 \cdot M \cdot N}{J} + 1 \le p \le \frac{4 \cdot M \cdot N \cdot k}{J} + \frac{M \cdot N}{J} - \frac{1}{2},$$

where k is an integer such that $k \le M \cdot N/J + \frac{1}{2}$.

For fourth-order quantization noise shaping, the above conditions result in quantization noise attenuation levels of greater than 42 dB (i.e., 7-bit resolution), in addition to signal-to-distortion ratio levels of greater than 48 dB (i.e., 8-bit resolution). For several exemplary cascaded moving-average (MA) filter transfer functions, Table 2 gives signal-to-distortion power ratios (SDR) and quantization noise attenuation ($A_{QN}$) based on fourth-order noise shaping and 65 processing branches (M). As Table 2 indicates, cascaded moving-average filters can realize quantization-noise-attenuation levels greater than 64 dB (i.e., 11-bit resolution), with greater than 280 dB signal-to-distortion ratios. The preferred embodiment of the MBO converter uses Moving Average Reconstruction (MAR), instead of conventional signal-reconstruction approaches, because MAR yields the superior performance of conventional filter banks combined with the low complexity of conventional comb filters, for large interleave factors (i.e., M>8).

TABLE 2

Cascaded MA Filter Responses for Moving Average Reconstruction (MAF)

| Transfer Function | Filter Length (L) | P = 2 $A_{QN}$ (dB) | P = 2 SDR (dB) | P = 4 $A_{QN}$ (dB) | P = 4 SDR (dB) |
|---|---|---|---|---|---|
| $F(z) = \left(\frac{1-z^{-2M}}{1-z^{-1}}\right)^2$ | 4·M − 1 | 39 | 282 | 48 | 282 |
| $F(z) = \left(\frac{1-z^{-M}}{1-z^{-1}}\right)^3$ | 3·M − 2 | 33 | 282 | 57 | 282 |
| $F(z) = \left(\frac{1-z^{-M}}{1-z^{-1}}\right)^4$ | 4·M − 3 | 35 | 282 | 60 | 282 |
| $F(z) = \left(\frac{1-z^{-M/2}}{1-z^{-1}}\right)^{16}$ | 8·M − 15 | 35 | 54 | 60 | 54 |
| $F(z) = \left(\frac{1-z^{-M/4}}{1-z^{-1}}\right)^{64}$ | 16·M − 63 | 34 | 53 | 59 | 53 |
| $F(z) = \left(\frac{1-z^{-2M}}{1-z^{-1}}\right)\left(\frac{1-z^{-M}}{1-z^{-1}}\right)^2$ | 4·M − 2 | 38 | 282 | 64 | 282 |

Besides exhibiting near-perfect-reconstruction properties and realizing high levels of quantization noise attenuation, cascaded moving-average filters of the type given in Table 2 can be very low in complexity because they require no multiplication operations. For example, the last filter given in Table 2 requires only 6 additions, independent of filter length (L=4·M−2), plus 4·M+3 registers, as illustrated by filter 340 in FIG. 14A. With these moving-average filters, the only multiplication operations required are those necessary for transforming lowpass responses to bandpass responses. Bandpass transformation based on quadrature downconversion and upconversion requires only 4 multiplies when direct digital synthesis (e.g., employing digital accumulators with sine/cosine lookup memories) is used to generate the sine ($x_n$) and cosine ($y_n$) sequences, shown in FIG. 13B as $\cos(\omega_0 t)$ and $\sin(\omega_0 t)$, that are needed for the quadrature downconversion and upconversion operations. Alternatively, the sine ($x_n$) and cosine ($y_n$) sequences can be generated using CORDICs (i.e., COordinate Rotation DIgital Computer) or other recursive filter functions that require no memory, such as those represented by the difference equations:

$$x_n = -2\cos(\omega_0) \cdot x_{n-1} + x_{n-2}$$

$$y_n = -\sin(\omega_0) \cdot x_{n-1} - 2\cos(\omega_0) \cdot y_{n-1} + y_{n-2}.$$

Although MAR using cascaded moving-average filters (MAFs), such as filter 340 described above, generally is preferred because such a structure provides a substantial savings in computational complexity, particularly for interleave factors (M) greater than 8, the conventional filter bank and window filter approaches can provide equal or less complexity for small interleave factors.

Figure 15:
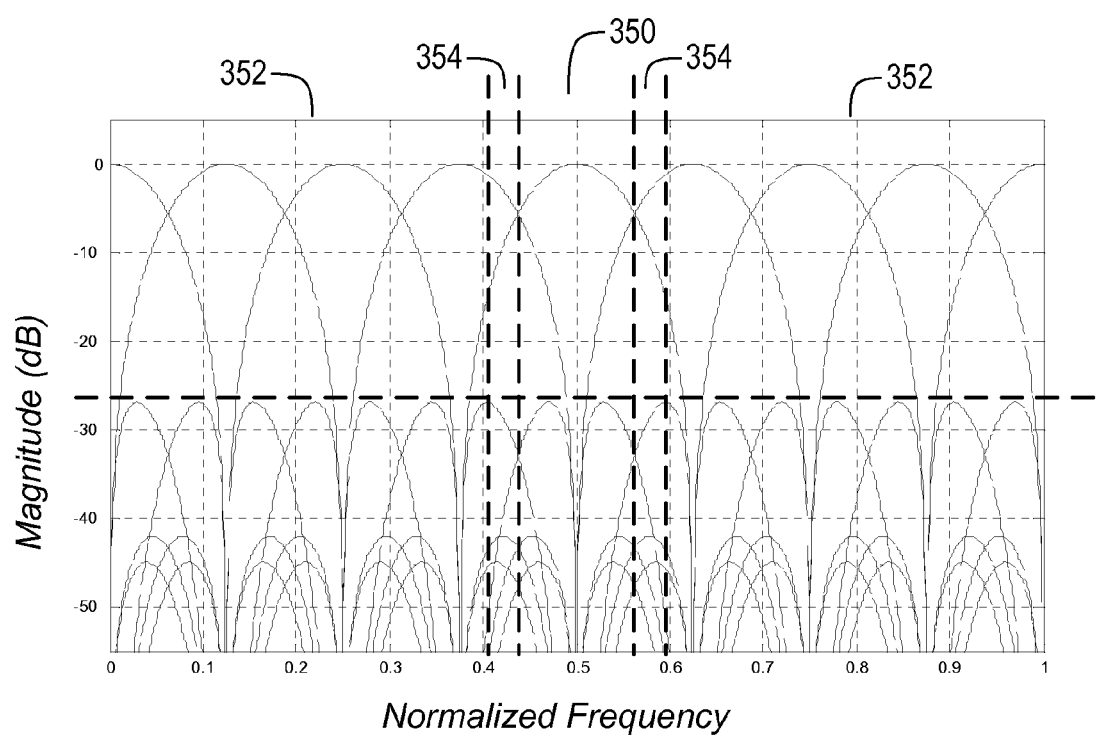
FIG. 15 illustrates frequency responses of bandpass Moving Average Reconstruction (MAR) filters used in a converter according to a representative embodiment of the present invention.

For an interleave factor of M=5, the frequency response of a Moving Average Reconstruction (MAR) system is shown in FIG. 15, based on moving-average filters 340 described above (i.e., last entry in Table 2), with evenly-spaced center frequencies, and after accounting for the frequency-translation effects of the downconversion and upconversion processes. Each of these bandpass filters includes a passband region 350, stopband regions 352 in which all frequencies are suppressed with an attenuation of at least 25 dB (resulting in a quantization noise attenuation of 64 dB for fourth-order noise shaping), and transition regions 354 between the passband region 350 and the stopband regions 352. For the filter centered at zero frequency, the transition regions 354 together occupy only approximately the same bandwidth as the passband region 350. For all filters other than the one centered at zero frequency, the transition regions 354 together only occupy approximately half of the bandwidth of the passband region 350. In addition, the amplitude and phase distortion of such a filter bank are negligible compared to a bank of filters that does not exhibit near-perfect reconstruction properties (e.g., $\text{sinc}^{P+1}$ filters).

As discussed in the Noise-Shaping Filter Considerations section, a representative embodiment of the invention can employ multiple processing channels (M) where, due to the dependence of the noise-shaping-filter response on the coarse tuning (delay) parameter ($T_1$), the quantization noise notch frequencies ($f_{notch}$) are not uniformly spaced and the orders (P) of the quantization noise-shaping responses are not the same across the converter processing branches. In this representative embodiment of the invention, it is preferable that the MAR filter center frequencies and bandwidths are also non-uniform, but rather are aligned with the notch frequencies ($f_{notch}$) and dependent upon the noise-shaping orders (P) of the DFLs in the respective processing branches. For DFLs with relatively higher order noise-shaping responses (i.e., lower $T_1$ relative to $1/f_S$), it is preferable for the MAR filters to have wider (preferably proportionally wider) bandwidths. Conversely, for DFLs with relatively lower order noise-shaping responses (i.e., higher $T_1$ relative to $1/f_S$), it is preferable for the MAR filters to have narrower (preferably proportionally narrower) bandwidths. Under these non-uniform conditions, it still is possible to realize near-perfect signal reconstruction using the MAR method.

In applications involving very high conversion rates, multi-rate filter structures based on polyphase decomposition can significantly reduce the clock speeds at which the Moving Average Reconstruction circuitry (e.g., digital multipliers and adders) operates. For example, consider a moving-average operation with transfer function $$F(z) = \frac{1-z^{-N}}{1-z^{-1}}.$$

The moving average operation can be represented by the difference equation $$y_n = x_n - x_{n-N} + y_{n-1},$$

and therefore, the difference equations for the first two output samples (i.e., n=1, 2) are $$y_2 = x_2 - x_{2-N} + y_1 \text{ and } y_1 = x_1 - x_{1-N} + y_0.$$

Substitution of $y_1$ into $y_2$ results in $$y_2 = x_2 - x_{2-N} + (x_1 - x_{1-N} + y_0) = x_2 + x_1 - x_{2-N} - x_{1-N} + y_0,$$

and the preceding equation can be generalized to $$y_n = x_n + x_{n-1} - x_{n-N} - x_{n-N-1} + y_{n-2}.$$

Because the calculation of $y_n$ requires only inputs and outputs that have been delayed by two or more samples in the above example, the moving-average function can be instantiated as a structure with two polyphase processing paths, each running at half the effective clock rate.

Figure 14A:
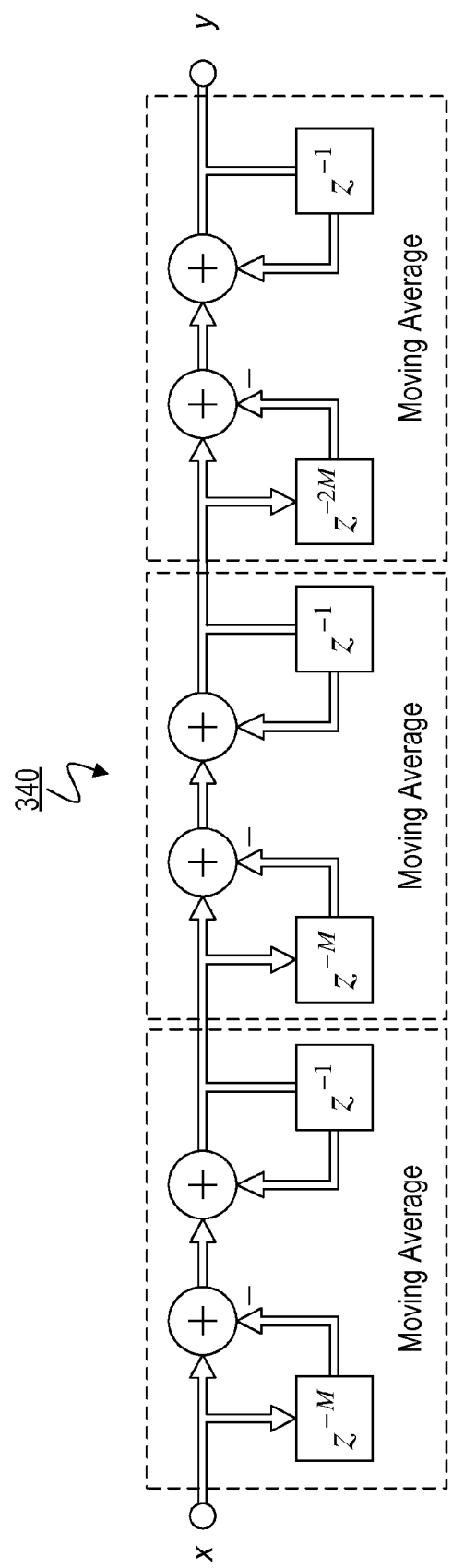
FIG. 14A is a block diagram of a signal reconstruction filter that includes cascaded moving-average functions with recursive operations.
Figure 14B:
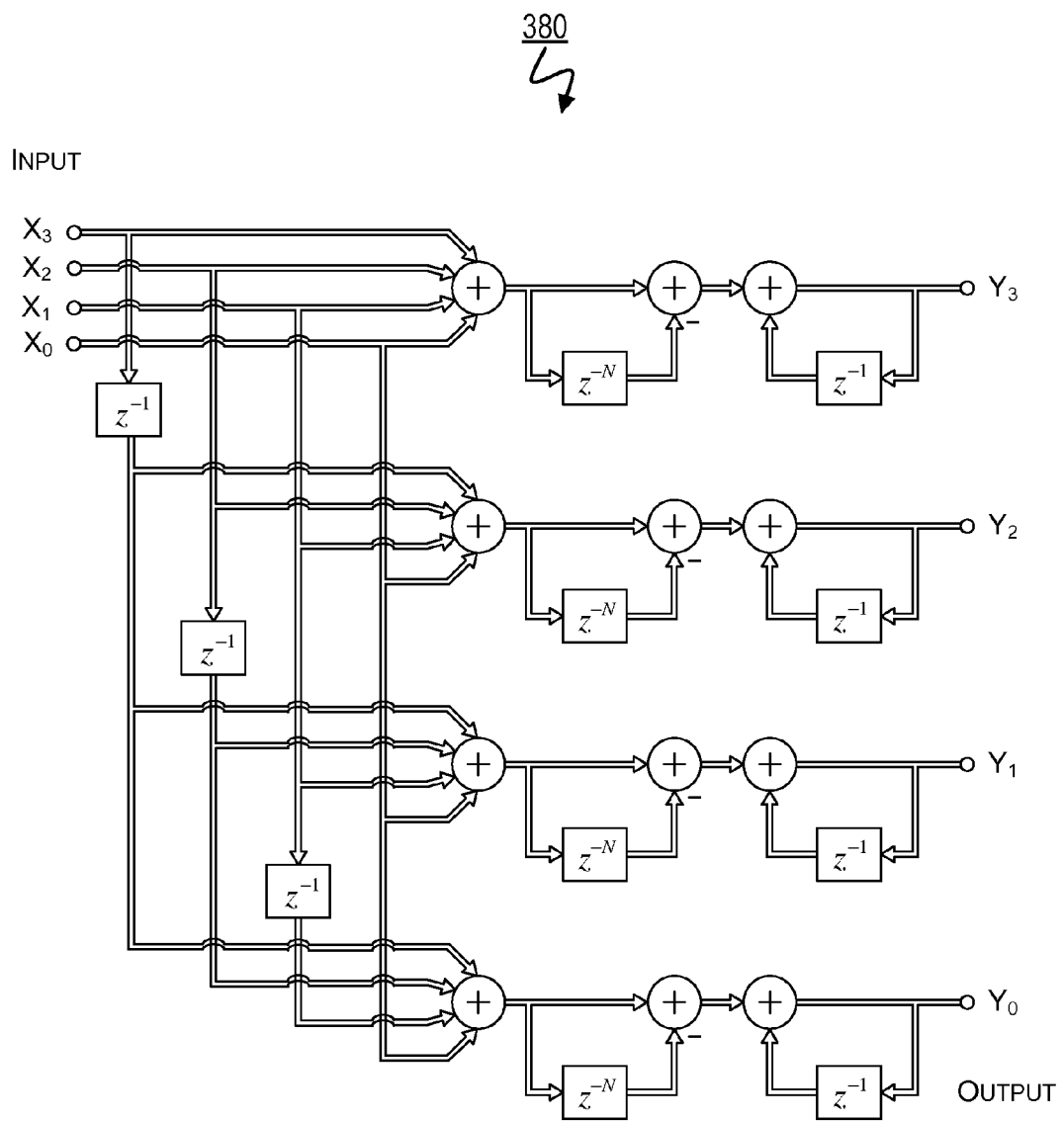
FIG. 14B is a simplified block diagram of a multi-rate moving-average filter having a polyphase decomposition factor of m=4.

The above technique can be extended to reduce clock rates further by using additional hardware to increase the number of polyphase processing paths. For example, FIG. 14B shows a block diagram for a moving-average filter 380 implemented using four polyphase processing paths (i.e., polyphase decomposition factor of m=4). As illustrated in FIG. 14A, the basic recursive form of the moving average filter requires two adders and M registers. Also, as shown in FIG. 14B for a polyphase decomposition factor of m=4, a multi-rate implementation of the filter requires 24 adders and 4·M+7 registers for integer ratios of M/n. In general, for a polyphase decomposition factor of m and M processing branches, the multi-rate moving-average filter requires $m^2+2\cdot m$ adders and $m\cdot(M+2)-1$ registers for integer ratios of M/n. Thus, ignoring registers, the complexity of the multi-rate, moving-average filter increases as $O(m^2)$ relative to the basic form of the filter.

Compared to conventional $\text{sinc}^{P+1}$ filters, the results in Table 2 indicate that cascaded moving-average filters provide comparable quantization noise attenuation with superior signal-to-distortion ratio performance. An additional benefit to the cascaded moving-average filter can be lower processing latency. Processing latency is determined by the filter length (L) such that latency $\approx L/(2 \cdot f_{CLK})$, where $f_{CLK}$ is the effective filter clock rate. Specifically, compared to conventional $\text{sinc}^{P+1}$ filters for fourth-order noise shaping (L=10·M−4), the cascaded moving-average filter response given in the last row of Table 2 has more than a 2× latency advantage (L=4·M−2). This advantage can be significant in applications involving control systems and servo mechanisms.

Overall Converter Considerations

The instantaneous bandwidth of the MBO converter technology (e.g., as shown in FIG. 6) is limited only by the maximum sample rate ($f_S$) of the sampling/quantization circuits 114. This sample rate, in turn, can be maximized by implementing circuits 114 as high-speed comparators (i.e., 1-bit quantizers), which currently can have instantaneous bandwidths greater than 10 GHz. Comparators having such bandwidths are commercially available in SiGe and InP™ integrated circuit process technology.

As noted previously, the resolution performance of the MBO converter can be increased without increasing the converter sample rate by increasing the interleave factor (i.e., the number of processing branches, M), the order of the DFL noise-shaping response, and/or the quality of the MAR bandpass filters. In addition, like conventional oversampling converters, the MBO converter technology is relatively insensitive to impairments such as clock jitter and thermal noise that degrade the performance of other high-speed converter architectures. This is because impairments such as clock jitter and hard-limiter (comparator) noise are subject to noise shaping in a similar manner to quantization noise, exhibiting a frequency response that enables significant attenuation by the MAR bandpass filters (e.g., filters 115 and 125).

Simulated resolution performance results for the MBO converter are given in Table 3 for various interleave factors and DFL noise-shaping orders.

TABLE 3

Simulated Performance Results for MBO Converter

| Interleave Factor | Noise-Shaping Order | Effective Bits of Resolution |
|---|---|---|
| 129 | 2 | 7.3 |
| 65 | 2 | 6.8 |
| 33 | 2 | 5.9 |
| 17 | 2 | 4.6 |
| 129 | 4 | 12.3 |
| 65 | 4 | 10.4 |
| 33 | 4 | 8.4 |
| 17 | 4 | 4.5 |

Summarizing, as compared to the conventional methods, the Multi-Channel Bandpass Oversampling converter generally can provide high-resolution, linear-to-discrete signal transformation (ADC conversion):

- with instantaneous bandwidth limited only by the maximum clock frequency of a one-bit comparator (e.g., greater than 10 GHz instantaneous bandwidth with commercially available SiGe or InP™ process technology);
- with conversion resolution and accuracy that are independent of instantaneous bandwidth or sample rate;
- with scalable conversion resolution that is a function of the number of processing branches (interleave factor), the order of the noise-shaping response in the DFL array, and the quality of the MAF bandpass filters (i.e., with conversion accuracy that increases with increasing interleave factor, noise-shaping order and/or bandpass-filter quality);
- with conversion resolution that, due to noise shaping, is relatively insensitive to traditional analog-to-digital conversion impairments, such as clock jitter, thermal noise, quantizer errors, and component tolerances that affect settling-time, bandwidth and gain;
- with continuous-time noise-shaping based on Diplexed Feedback Loops that can be implemented using distributed microwave design principles and can be actively calibrated using relatively simple control loops and error metrics;
- with digital-signal-processing operations that can be implemented using low-complexity moving-average filters and using polyphase decomposition to reduce required clock rates; and
- with a novel method that combines frequency interleaving with bandpass oversampling to eliminate the need for complex analog signal reconstruction filters (i.e., analysis/synthesis filter banks).

Figure 16:
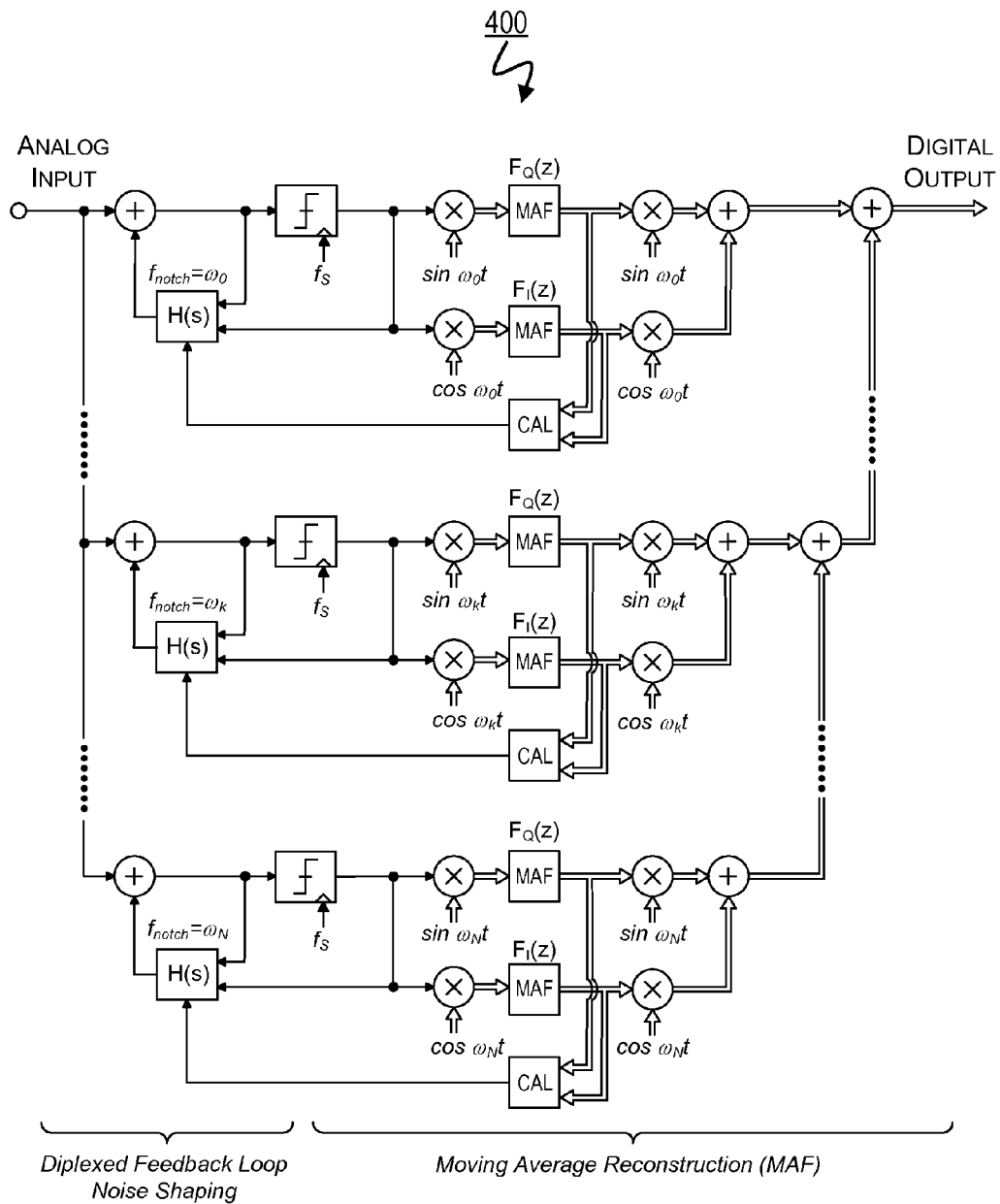
FIG. 16 is a block diagram of a complete MBO converter according to a representative embodiment of the present invention, which incorporates multiple Diplexed Feedback Loop (DFL) noise-shaping filters in conjunction with a Moving Average Reconstruction (MAR) filter.
Figure 17:
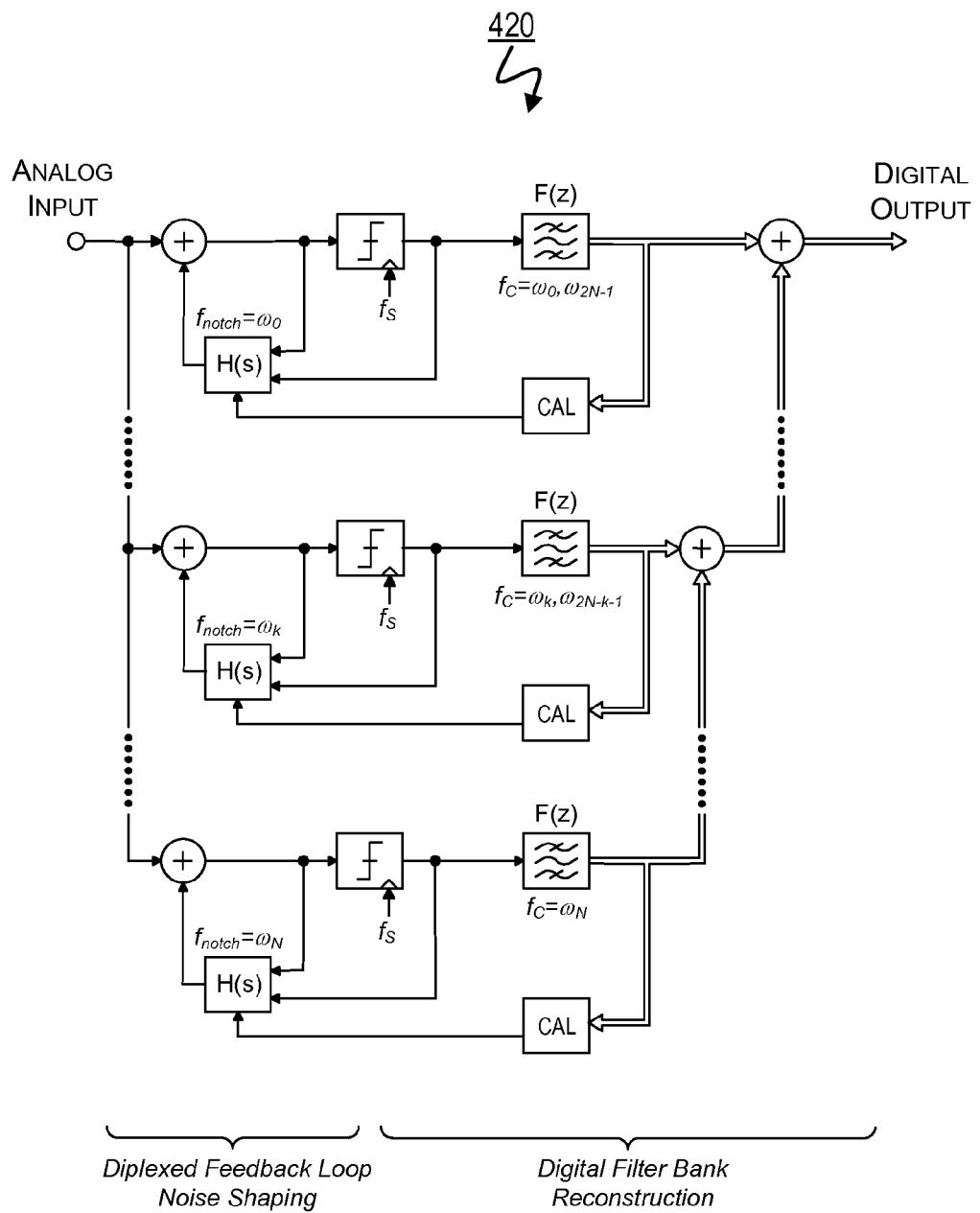
FIG. 17 is a block diagram of a complete MBO converter according to a first alternate representative embodiment of the present invention, which incorporates multiple Diplexed Feedback Loop (DFL) noise-shaping filters in conjunction with a conventional filter bank for signal reconstruction.
Figure 18:
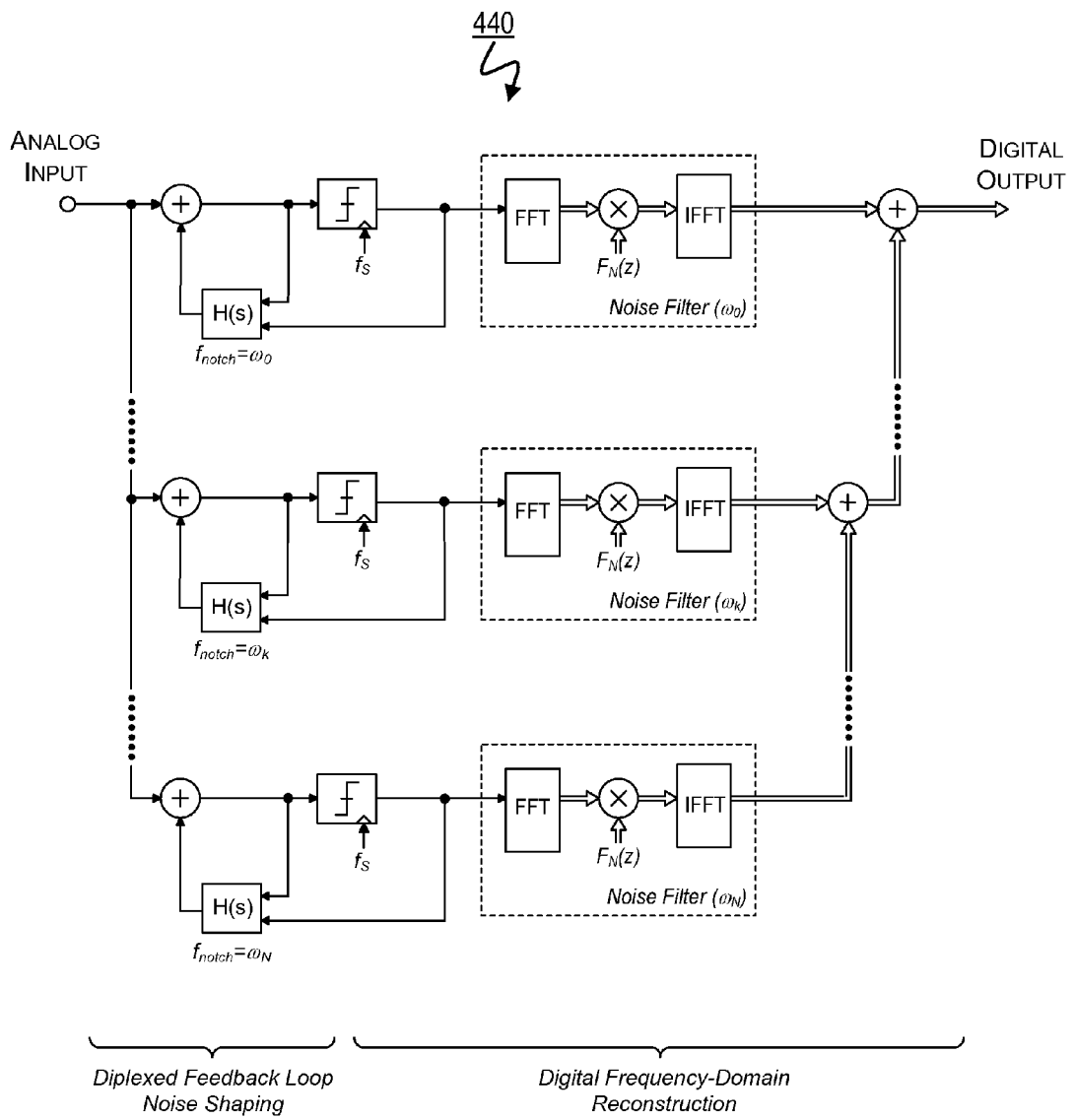
FIG. 18 is a block diagram of a complete MBO converter according to a second alternate embodiment of the present invention, which incorporates multiple Diplexed Feedback Loop (DFL) noise-shaping filters in conjunction with a frequency-domain filter bank for signal reconstruction.

FIG. 16 illustrates a complete MBO converter 400 having single-stage, DFL noise-shaping of the type illustrated in FIG. 7 and signal reconstruction via the preferred method of MAR (i.e., with filter center frequencies corresponding to the centers for the frequency bands that are being processed in the respective branches). FIG. 17 illustrates a complete MBO converter 420 having single-stage, DFL noise-shaping of the type illustrated in FIG. 7 and signal reconstruction via the alternative method of a conventional filter bank. FIG. 18 illustrates a complete MBO converter 440 having single-stage, DFL noise-shaping of the type illustrated in FIG. 7 and bandpass filters implemented through the use of linear convolution by discrete Fourier transform.

Figure 19:
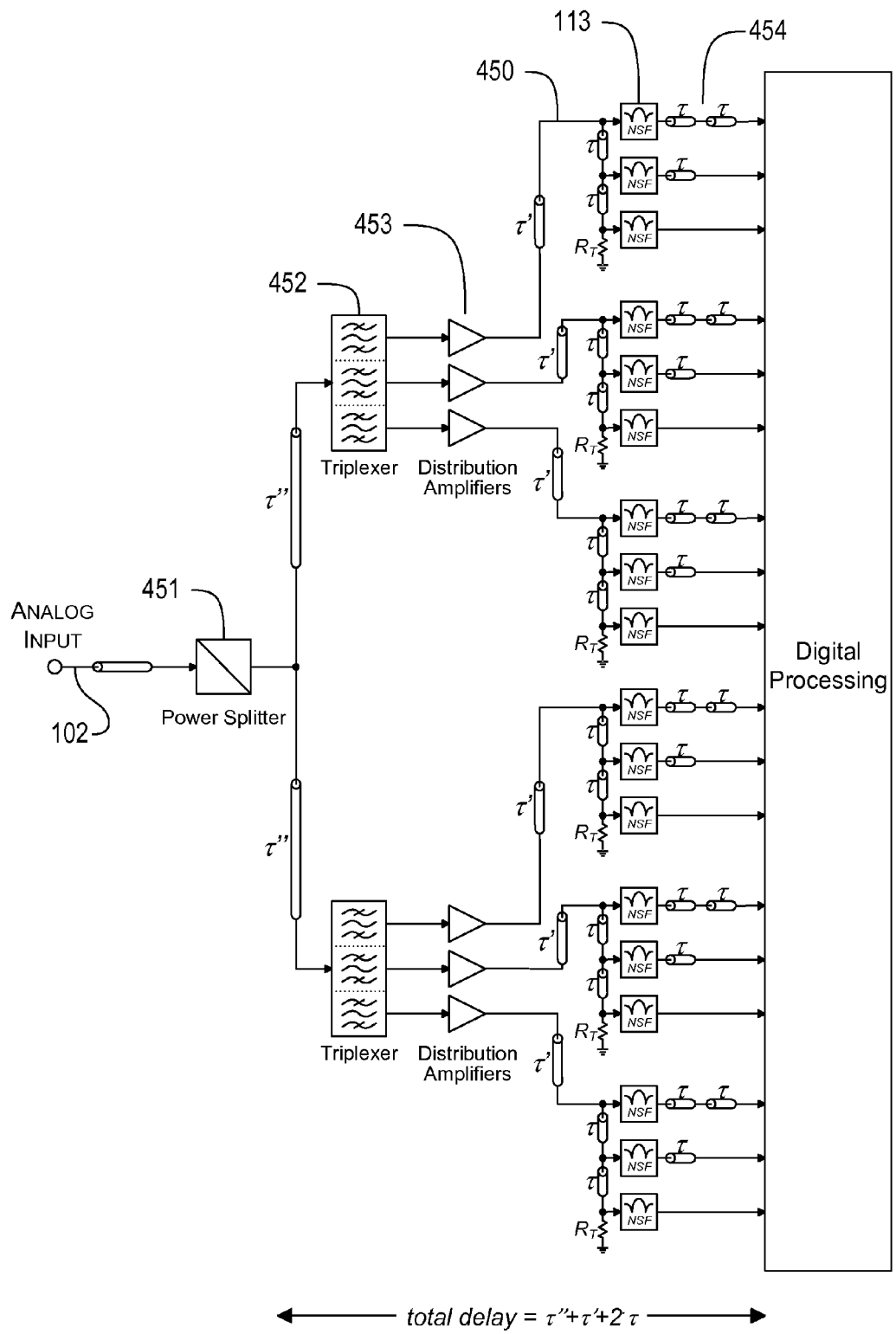
FIG. 19 is a block diagram of a complete MBO converter illustrating an exemplary method for signal distribution across multiple converter channels.

Because the input to each DFL noise-shaping circuit can be designed for high impedance (>200 ohms), it is possible to "tap off" multiple noise-shaping circuits 113 from a single controlled impedance transmission line 450 as shown in FIG. 19. For a 50-ohm system with noise-shaping circuits 113 having greater than 200 ohm input impedances, preferably fewer than 8 noise shapers 113 are tapped off the same transmission line 450 to prevent appreciable loss of signal integrity. The tapped transmission line arrangement simplifies the distribution of the data converter's single analog input to the multiple noise shapers in the array. As shown in FIG. 19, this tapped transmission line technique can be combined with conventional signal-distribution approaches, such as those employing power splitters 451, m-ary diplexers 452 and distribution amplifiers 453, to achieve an optimal trade-off between signal integrity, additive noise, and circuit complexity. Specifically, FIG. 19 shows an exemplary embodiment that combines splitters 451, triplexers 452, distribution amplifiers 453, and the tapped transmission line 450 methods for signal distribution in a system comprising twelve noise shapers 113.

Severe propagation skew (i.e., delay offsets) between the DFLs in the converter array can degrade conversion accuracy. Therefore, to ensure that the analog input signal propagates with equal (or approximately equal) delay to the output of each noise shaper in the array, transmission delay introduced by the tapped transmission line preferably is compensated with added delay 454 at the DFL outputs, as shown in FIG. 19. In the exemplary embodiment shown in FIG. 19, the delay between the analog input and each of the twelve DFL outputs is $\tau''+\tau'+2\tau$.

Finally, it should be noted that the frequency bands processed by the branches (e.g., 110 or 120) may be of equal or unequal widths. That is, rather than frequencies that are spaced uniformly across the converter output bandwidth, such frequencies instead can be non-uniformly spaced.

System Environment.

Generally speaking, except where clearly indicated otherwise, all of the systems, methods, functionality and techniques described herein can be practiced with the use of one or more programmable general-purpose computing devices. Such devices typically will include, for example, at least some of the following components interconnected with each other, e.g., via a common bus: one or more central processing units (CPUs); read-only memory (ROM); random access memory (RAM); input/output software and circuitry for interfacing with other devices (e.g., using a hardwired connection, such as a serial port, a parallel port, a USB connection or a firewire connection, or using a wireless protocol, such as Bluetooth or a 802.11 protocol); software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; a display (such as a cathode ray tube display, a liquid crystal display, an organic light-emitting display, a polymeric light-emitting display or any other thin-film display); other output devices (such as one or more speakers, a headphone set and a printer); one or more input devices (such as a mouse, touchpad, tablet, touch-sensitive display or other pointing device, a keyboard, a keypad, a microphone and a scanner); a mass storage unit (such as a hard disk drive); a real-time clock; a removable storage read/write device (such as for reading from and writing to RAM, a magnetic disk, a magnetic tape, an opto-magnetic disk, an optical disk, or the like); and a modem (e.g., for sending faxes or for connecting to the Internet or to any other computer network via a dial-up connection). In operation, the process steps to implement the above methods and functionality, to the extent performed by such a general-purpose computer, typically initially are stored in mass storage (e.g., the hard disk), are downloaded into RAM and then are executed by the CPU out of RAM. However, in some cases the process steps initially are stored in RAM or ROM.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, workstations, personal computers and/or even smaller computers, such as PDAs, wireless telephones or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these, with the particular implementation being selected based on known engineering tradeoffs. More specifically, where any process and/or functionality described above is implemented in a fixed, predetermined and/or logical manner, it can be accomplished by a general-purpose processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible media on which are stored software or firmware program instructions (i.e., computer-executable process instructions) for performing the methods and functionality of this invention. Such media include, by way of example, magnetic disks, magnetic tape, optically readable media such as CD ROMs and DVD ROMs, or semiconductor memory such as PCMCIA cards, various types of memory cards, USB memory devices, etc. In each case, the medium may take the form of a portable item such as a miniature disk drive or a small disk, diskette, cassette, cartridge, card, stick etc., or it may take the form of a relatively larger or immobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server device, computer-readable medium or other storage device, client device, or any other kind of device, such references should be understood as encompassing the use of plural such processors, computers, server devices, computer-readable media or other storage devices, client devices, or any other devices, except to the extent clearly indicated otherwise. For instance, a server generally can be implemented using a single device or a cluster of server devices (either local or geographically dispersed), e.g., with appropriate load balancing.

Additional Considerations.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for converting a continuous-time, continuously variable signal into a sampled and quantized signal, comprising:
    an input line for accepting an input signal that is continuous in time and continuously variable;
    a plurality of processing branches coupled to the input line, each of said processing branches including: (a) a quantization-noise-shaping continuous-time filter, (b) a sampling/quantization circuit coupled to an output of the quantization noise-shaping continuous-time filter, (c) a digital bandpass filter coupled to an output of the sampling/quantization circuit, and (d) a line coupling the output of the sampling/quantization circuit back into the quantization-noise-shaping continuous-time filter; and
    an adder coupled to outputs of the plurality of processing branches,
    wherein each of said quantization-noise-shaping continuous-time filters comprises an adder that includes a plurality of inputs and an output, with the input signal being coupled to one of the inputs of the adder, the output of the adder being coupled to one of the inputs of the adder through a first filter, the output of the sampling/quantization circuit in the same processing branch being coupled to one of the inputs of the adder through a second filter, and the second filter having a different transfer function than the first filter,
    wherein the quantization-noise-shaping continuous-time filters in different ones of the plurality of processing branches have quantization noise minima at different frequencies, and
    wherein the quantization noise minimum for each of the quantization-noise-shaping continuous-time filters corresponds to a frequency band selected by the digital bandpass filter in the same processing branch.

2. An apparatus according to claim 1, wherein said plurality of processing branches includes a total of M said processing branches, wherein said sampling/quantization circuit samples at a rate of $2 \cdot N \cdot BW$ samples per second, with BW being the bandwidth of the frequency band for the corresponding processing branch, and wherein $M \times N$ is at least 16.

3. An apparatus according to claim 1, wherein the plurality of processing branches includes at least 16 said processing branches.

4. An apparatus according to claim 1, wherein each said quantization noise-shaping continuous-time filter comprises distributed-element components and monolithic microwave integrated circuits (MMICs).

5. An apparatus according to claim 1, wherein each said quantization noise-shaping continuous-time filter incorporates a delay element that provides a delay of at least ¼ of a sampling period used by the sampling/quantization circuit.

6. An apparatus according to claim 1, wherein each said quantization noise-shaping continuous-time filter incorporates a delay element that provides a delay of at least ½ of a sampling period used by the sampling/quantization circuit.

7. An apparatus according to claim 1, wherein the quantization noise-shaping continuous-time filter is second-order.

8. An apparatus according to claim 1, wherein the quantization noise-shaping continuous-time filter is fourth-order.

9. An apparatus according to claim 1, wherein the notch frequencies of the plurality of quantization noise-shaping continuous-time filters are spaced at non-equal frequency intervals.

10. An apparatus according to claim 1, wherein the digital bandpass filter in each of a plurality of said processing branches comprises a frequency downconverter, a lowpass filter and a frequency upconverter.

11. An apparatus according to claim 1, wherein the digital bandpass filter is comprised of cascaded moving-average operations that collectively provide spectral notches at frequencies other than multiples of the output data rate of said apparatus.

12. An apparatus according to claim 11, wherein at least one of the digital bandpass filters is implemented as a polyphase decomposition structure.

13. An apparatus according to claim 12, wherein a polyphase decomposition factor of the polyphase decomposition structure is a submultiple of the number of processing branches, M.

14. An apparatus according to claim 1, wherein the sampling/quantization circuit in each of a plurality of said processing branches is a single-bit quantizer.

15. An apparatus according to claim 1, wherein the sampling/quantization circuit in each of a plurality of said processing branches is a multi-bit quantizer.

16. An apparatus according to claim 1, wherein the sampling/quantization circuit in each of a plurality of said processing branches samples at a frequency of at least 1 gigahertz (GHz).

17. An apparatus according to claim 1, wherein the digital bandpass filters in different ones of said processing branches select different frequency bands that collectively cover a desired frequency range.

18. An apparatus according to claim 1, wherein the digital bandpass filters in different ones of said processing branches have at least one of: (i) center frequencies that are spaced at non-equal intervals, and (ii) bandwidths that are not all equal to each other.

19. An apparatus according to claim 1, wherein the digital bandpass filter in each of a plurality of said processing branches attenuates shaped quantization noise by at least 40 dB.

20. An apparatus according to claim 1, wherein the digital bandpass filter in each of a plurality of said processing branches attenuates shaped quantization noise by at least 60 dB.

21. An apparatus according to claim 1, wherein the digital bandpass filter in each of a plurality of said processing branches attenuates shaped quantization noise by at least 80 dB.

22. An apparatus according to claim 1, wherein the digital bandpass filter in each of a plurality of said processing branches introduces total distortion power limited to less than 40 dB below data converter signal level.

23. An apparatus according to claim 1, wherein the digital bandpass filter in each of a plurality of said processing branches introduces total distortion power limited to less than 50 dB below data converter signal level.

24. An apparatus according to claim 1, wherein the quantization noise minima are provided by the quantization-noise-shaping continuous-time filters at a set of frequencies that are at least approximately orthogonal to each other over the converter output data rate.

25. An apparatus according to claim 1, wherein the digital bandpass filter in each of a plurality of said processing branches comprises a digital finite-impulse-response (FIR) filter having an impulse-response length of at least $2 \cdot N \cdot (M-1)$, where N is an excess-rate oversampling ratio and M is the number of processing branches.

26. An apparatus according to claim 1, wherein the digital bandpass filter in each of a plurality of said processing branches comprises a digital finite-impulse-response (FIR) filter having an impulse-response length of at least $4 \cdot N \cdot (M-1)$, where N is an excess-rate oversampling ratio and M is the number of processing branches.

27. An apparatus according to claim 26, wherein the digital bandpass filters are implemented as polyphase decomposition structures.

28. An apparatus according to claim 1, further comprising a tapped transmission line distribution structure for providing the input signal to a plurality of the quantization-noise-shaping continuous-time filters.

29. An apparatus according to claim 1, wherein the plurality of processing branches includes at least 4 said processing branches, and in each of a plurality of said processing branches: the quantization-noise-shaping continuous-time filter is at least a second-order feedback filter, the sampling/quantization circuit samples at a frequency of at least 1 gigahertz (GHz), and the digital bandpass filter attenuates shaped quantization noise by at least 40 dB and introduces total aliasing distortion power limited to less than 40 dB below data converter signal level.

30. An apparatus according to claim 1, further comprising an active calibration component that adjusts a parameter of at least one component of the quantization-noise-shaping continuous-time filter.

31. An apparatus according to claim 1, wherein the bandpass filters are implemented by linear convolution using a discrete Fourier transform.

32. An apparatus according to claim 1, further comprising delay elements at outputs of the quantization-noise-shaping continuous-time filters to compensate for signal propagation delay skews which otherwise would occur.

33. An apparatus according to claim 1, wherein each said quantization noise-shaping continuous-time filter consists solely of gain components and delay elements.

34. An apparatus according to claim 1, wherein each said quantization noise-shaping continuous-time filter separately filters a first signal that is input to the sampling/quantization circuit and a second signal that is output from the sampling/quantization circuit and then combines said filtered first and second signals, and wherein each said filtering of the first signal and the second signal non-trivially modifies at least one of amplitude and phase.

35. An apparatus according to claim 34, wherein each said filtering of the first signal and the second signal comprises delaying by more than ¼ of a sampling period used by the sampling/quantization circuit ($T_s$) and lowpass filtering with a 3 dB bandwidth that is less than $1/T_s$.

36. An apparatus according to claim 35, wherein each said filtering of the first signal and the second signal comprises delay elements that are implemented using transmission lines.

37. An apparatus according to claim 34, wherein the quantization noise-shaping continuous-time filter shapes quantization noise with a second-order response.

38. An apparatus according to claim 34, wherein the quantization noise-shaping continuous-time filter shapes quantization noise with a fourth-order response.

39. An apparatus according to claim 1, wherein the digital bandpass filter is comprised of cascaded moving average operations with a combined order other than one plus an order of the quantization-noise-shaping continuous-time filter.

* * * * *

UNITED STATES PATENT AND TRADEMARK OFFICE
CERTIFICATE OF CORRECTION

PATENT NO. : 8,089,382 B2  
APPLICATION NO. : 12/824171  
DATED : January 3, 2012  
INVENTOR(S) : Christopher Pagnanelli Page 1 of 1

It is certified that error appears in the above-identified patent and that said Letters Patent is hereby corrected as shown below:

IN THE SPECIFICATIONS:

In column 8 line 61, change "the noise-shaping filter (preferably, a DFL filter) notch, of and" to --of the noise-shaping filter (preferably, a DFL filter) and--.

In column 16 line 21, change "parameters $T_i$ and $\beta_l$ noise response," to --parameters $T_i$ and $\beta_i$ determine the coarse location of a relatively narrowband null ($f_{notch}$) in the quantization noise response,--.

Signed and Sealed this  
Eighth Day of May, 2012

David J. Kappos  
*Director of the United States Patent and Trademark Office*